US011901944B2

(12) United States Patent
Jing et al.

(10) Patent No.: US 11,901,944 B2
(45) Date of Patent: Feb. 13, 2024

(54) POWER AND DATA TRANSMISSION TO SUBSTRATE SUPPORT IN PLASMA CHAMBERS VIA OPTICAL FIBER

(71) Applicant: LAM RESEARCH CORPORATION, Fremont, CA (US)

(72) Inventors: Changyou Jing, Livermore, CA (US); Fred Egley, Sunnyvale, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 48 days.

(21) Appl. No.: 17/617,517

(22) PCT Filed: Jun. 8, 2020

(86) PCT No.: PCT/US2020/036571
§ 371 (c)(1),
(2) Date: Dec. 8, 2021

(87) PCT Pub. No.: WO2020/251876
PCT Pub. Date: Dec. 17, 2020

(65) Prior Publication Data
US 2022/0247492 A1 Aug. 4, 2022

Related U.S. Application Data

(60) Provisional application No. 62/859,344, filed on Jun. 10, 2019.

(51) Int. Cl.
*H04B 10/25* (2013.01)
*H01J 37/32* (2006.01)
(Continued)

(52) U.S. Cl.
CPC .... *H04B 10/2589* (2020.05); *H01J 37/32935* (2013.01); *H04B 10/564* (2013.01); *H04B 10/807* (2013.01)

(58) Field of Classification Search
CPC .............. H04B 10/2589; H04B 10/564; H04B 10/807; H04B 10/40; H04B 10/43;
(Continued)

(56) References Cited

U.S. PATENT DOCUMENTS 8,358,893 B1 * 1/2013 Sanderson ........... G02B 6/4415
385/115
8,526,810 B2 9/2013 Cole et al.
(Continued)

OTHER PUBLICATIONS

Broadcom, "AFBR-POCxxxL: Optical Power Converter" Data Sheet. AFBR-POCxxxL-DS103; Mar. 15, 2018, 11 Pages.
(Continued)

*Primary Examiner* — Hibret A Woldekidan

(57) ABSTRACT

A substrate support assembly comprises a first optical receiver, a power converter, a first circuit, and a first optical transmitter, all embedded in the substrate support assembly. The first optical receiver is configured to receive a first optical signal and a first optical data through a fiber optic cable. The power converter is configured to generate DC power based on the first optical signal and the first optical data received by the first optical receiver. The first circuit is configured to receive the DC power from the power converter and to receive a second data from a sensor disposed in the substrate support assembly in response to the first optical data. The first optical transmitter is configured to transmit the second data as a second optical data through the fiber optic cable.

24 Claims, 17 Drawing Sheets

(51) Int. Cl.
    *H04B 10/564* (2013.01)
    *H04B 10/80* (2013.01)
(58) Field of Classification Search
    CPC ...... H04B 10/50; H04B 10/60; H04B 10/501;
        H04B 10/502; H04B 10/503; H04B
        10/504; H01J 37/32935; H01J 37/32715;
        H01J 37/32926; G02B 6/4246
    USPC .................................................. 398/135–139
    See application file for complete search history.

(56) References Cited

U.S. PATENT DOCUMENTS

| | | | |
|---|---|---|---|
| 2006/0165417 A1* | 7/2006 | Hsieh | H04B 10/40 |
| | | | 398/138 |
| 2017/0254755 A1 | 9/2017 | Cho et al. | |
| 2019/0007138 A1* | 1/2019 | Chamberlain | H04J 14/04 |
| 2019/0013187 A1 | 1/2019 | Meloni | |

OTHER PUBLICATIONS

Fischer, Jakob et al., "Isolated sensor networks for high-voltage environments using a single polymer optical fiber and LEDs for remote powering as well as data transmission", Journal of Sensors and Sensor Systems: 7, 193-206, 2018; Copernicus Publications on behalf of the AMA Associate for Sensor Technology; Mar. 27, 2018; 14 Pages.

International Search Report and Written Opinion of the ISA issued in PCT/US2020/036571, dated Sep. 17, 2020; ISA/KR.

* cited by examiner

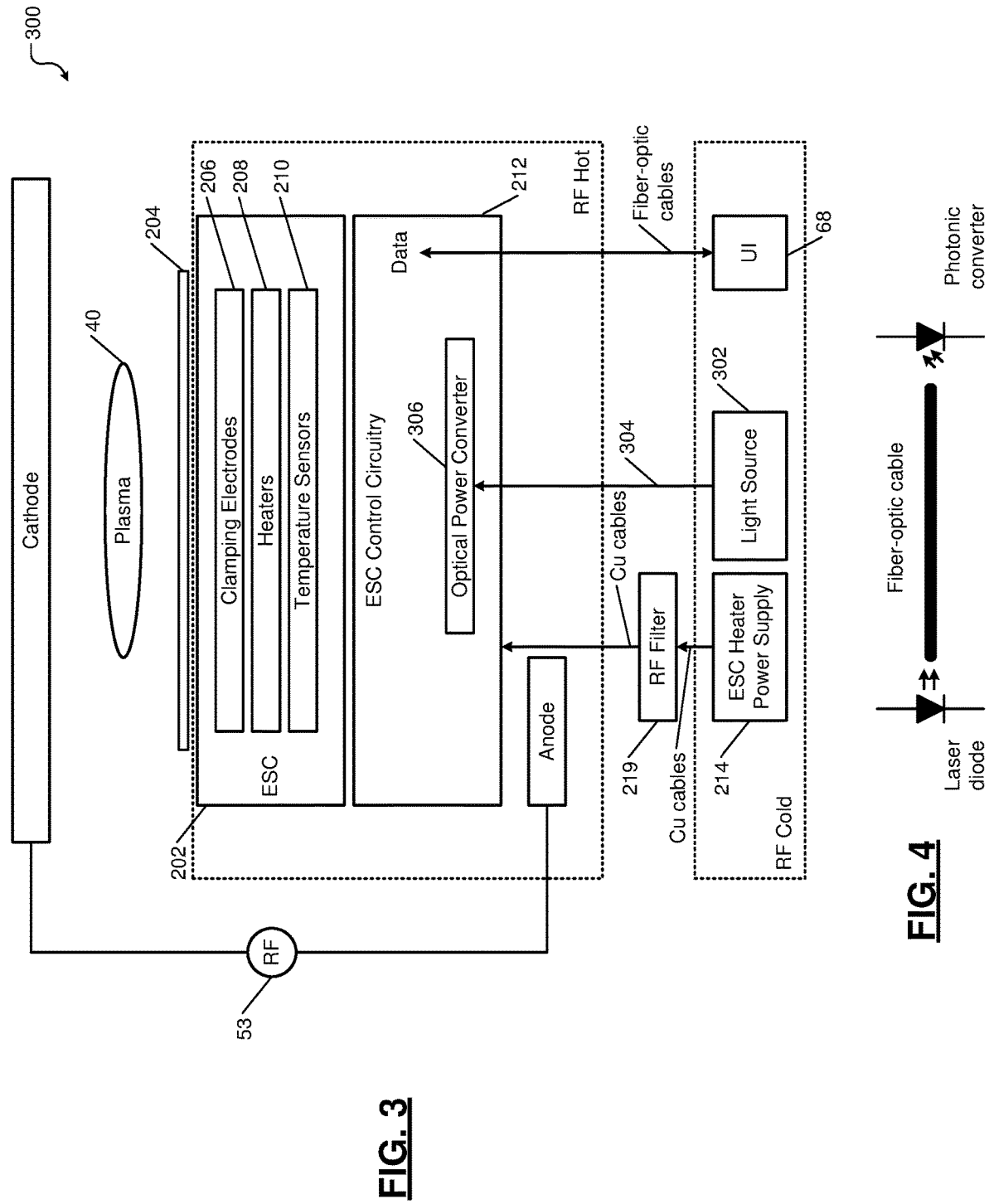

POWER AND DATA TRANSMISSION TO SUBSTRATE SUPPORT IN PLASMA CHAMBERS VIA OPTICAL FIBER

CROSS-REFERENCE TO RELATED APPLICATIONS

This application is a U.S. National Phase Application under 35 U.S.C. 371 of International Application No. PCT/US2020/036571, filed on Jun. 8, 2020, which claims the benefit of U.S. Provisional Application No. 62/859,344, filed on Jun. 10, 2019. The entire disclosures of the applications referenced above are incorporated herein by reference.

FIELD

The present disclosure relates generally to substrate processing systems and more particularly to transmitting power and data to substrate support in plasma chambers via optical fiber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD) process, a chemically enhanced plasma vapor deposition (CEPVD) process, and a sputtering physical vapor deposition (PVD) process. Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. A computer-controlled robot typically transfers substrates from one processing chamber to another in a sequence in which the substrates are to be processed.

SUMMARY

A substrate support assembly comprises a first optical receiver, a power converter, a first circuit, and a first optical transmitter, all embedded in the substrate support assembly. The first optical receiver is configured to receive a first optical signal and a first optical data through a fiber optic cable. The power converter is configured to generate DC power based on the first optical signal and the first optical data received by the first optical receiver. The first circuit is configured to receive the DC power from the power converter and to receive a second data from a sensor disposed in the substrate support assembly in response to the first optical data. The first optical transmitter is configured to transmit the second data as a second optical data through the fiber optic cable.

In other features, the first optical receiver and the first optical transmitter are coupled to the fiber optic cable through a first optical splitter. The first optical receiver is configured to receive, through the first optical splitter, a portion of the second optical data transmitted by the first optical transmitter. The power converter is configured to generate the DC power additionally based on the portion of the second optical data received by the first optical receiver.

In other features, the substrate support assembly further comprises a first current sensor to sense current through the first optical receiver. The first circuit is configured to determine, based on the sensed current, whether one or more of the first optical receiver, the first optical transmitter, the first optical splitter, and the first current sensor is malfunctioning.

In other features, the substrate support assembly further comprises a first current sensor to sense current through the first optical receiver. The first circuit is configured to determine, based on the sensed current, whether the first optical transmitter correctly transmitted the second optical data.

In other features, a system comprising the substrate support assembly further comprises a second optical transmitter, a second optical receiver, and a controller. The second optical transmitter is coupled to a remote end of the fiber optic cable to transmit the first optical signal and the first optical data through the fiber optic cable. The second optical receiver is coupled to the remote end of the fiber optic cable to receive the second optical data through the fiber optic cable. The controller is configure to supply power to the second optical transmitter at a first power level when the second optical transmitter transmits the first optical signal. The controller is configure to toggle the power supplied to the second optical transmitter between the first power level and a second power level when the second optical transmitter transmits the first optical data.

In other features, the substrate support assembly further comprises a second circuit embedded in the substrate support assembly to toggle power supplied to the first optical transmitter between zero and a third power level when the first optical transmitter transmits the second optical data. The third power level is greater than the second power level. The second power level is greater than the first power level.

In other features, the second optical receiver and the second optical transmitter are coupled to the fiber optic cable through a second optical splitter. The second optical receiver is configured to receive, through the second optical splitter, a portion of the first optical signal and the first optical data transmitted by the second optical transmitter. A second current sensor to sense current through the second optical receiver. The controller is configured to determine, based on the sensed current, whether one or more of the second optical receiver, the second optical transmitter, the second optical splitter, and the second current sensor is malfunctioning.

In other features, the second optical receiver and the second optical transmitter are coupled to the fiber optic cable through a second optical splitter. The second optical receiver is configured to receive, through the second optical splitter, a portion of the first optical signal and the first optical data transmitted by the second optical transmitter. A second current sensor to sense current through the second optical receiver. The controller is configured to determine, based on the sensed current, whether the second optical transmitter correctly transmitted the first optical data.

In other features, the controller is configured to generate a first data to control a frequency at which the first circuit receives the second data from the sensor. The second optical transmitter is configured to transmit the first data as the first optical data.

In other features, the controller is configured to generate a third data based on the second data to control one or more heaters disposed in the substrate support assembly. The second optical transmitter is configured to transmit the third data as a third optical data. The first optical receiver is configured to receive the third optical data. The first circuit is configured to obtain the third data from the third optical data and to control the one or more heaters based on the third data.

In other features, the controller is configured to generate a third data to identify a component in the substrate support assembly. The second optical transmitter is configured to transmit the third data as a third optical data. The first optical receiver is configured to receive the third optical data. The first circuit is configured to obtain the third data from the third optical data and to associate the third data with the component.

In other features, the first circuit is configured to receive a third data from a component in the substrate support assembly, the third data identifying the component. The first optical transmitter is configured to transmit the third data as a third optical data. The second optical receiver is configured to receive the third optical data. The controller is configured to obtain the third data from the third optical data and to generate a fourth data based on the third data to control the component. The second optical transmitter is configured to transmit the fourth data as a fourth optical data. The first optical receiver is configured to receive the fourth optical data. The first circuit is configured to obtain the fourth data from the fourth optical data and to control the component based on the fourth data.

In still other features, a system comprises a first optical transmitter coupled to a first end of a fiber optic cable, a first optical receiver coupled to the first end of the fiber optic cable, and a controller to supply power to the first optical transmitter to transmit a first optical signal and a first optical data through the fiber optic cable. The system further comprises a substrate support assembly comprising a second optical receiver, a power converter, a first circuit, and a second optical transmitter, all embedded in the substrate support assembly. The second optical receiver is coupled to a second end of the fiber optic cable to receive the first optical signal and the first optical data. The power converter is configured to generate DC power based on the first optical signal and the first optical data received by the second optical receiver. The first circuit is configured to receive the DC power and to receive a second data from a sensor disposed in the substrate support assembly in response to the first optical data. The second optical transmitter is coupled to the second end of the fiber optic cable to transmit the second data as a second optical data through the fiber optic cable based on power received from the first circuit.

In other features, the controller is configured to supply the power to the first optical transmitter at a first power level to transmit the first optical signal through the fiber optic cable. The controller is configured to switch the power supplied to the first optical transmitter between the first power level and a second power level to transmit the first optical data through the fiber optic cable, where the second power level is greater than the first power level. The first circuit is configured to switch the power supplied to the second optical transmitter between zero and a third power level when the second optical transmitter transmits the second optical data, the third power level being greater than the second power level.

In other features, the second optical receiver and the second optical transmitter are coupled to the fiber optic cable through an optical splitter. The second optical receiver is configured to receive, through the optical splitter, a portion of the second optical data transmitted by the second optical transmitter. The power converter is configured to generate the DC power additionally based on the portion of the second optical data received by the first optical receiver.

In other features, the system further comprises a current sensor to sense current through the second optical receiver. The first circuit is configured to determine, based on the sensed current, whether one or more of the second optical receiver, the second optical transmitter, the optical splitter, and the current sensor is malfunctioning.

In other features, the system further comprises a current sensor to sense current through the second optical receiver. The first circuit is configured to determine, based on the sensed current, whether the second optical transmitter correctly transmitted the second optical data.

In other features, the first optical receiver and the first optical transmitter are coupled to the fiber optic cable through an optical splitter. The first optical receiver is configured to receive, through the optical splitter, a portion of the first optical signal and the first optical data transmitted by the first optical transmitter. A current sensor to sense current through the first optical receiver. The controller is configured to determine, based on the sensed current, whether one or more of the first optical receiver, the first optical transmitter, the optical splitter, and the current sensor is malfunctioning.

In other features, the first optical receiver and the first optical transmitter are coupled to the fiber optic cable through an optical splitter. The first optical receiver is configured to receive, through the optical splitter, a portion of the first optical signal and the first optical data transmitted by the first optical transmitter. A current sensor to sense current through the first optical receiver. The controller is configured to determine, based on the sensed current, whether the first optical transmitter correctly transmitted the first optical data.

In other features, the controller is configured to generate a first data to control a frequency at which the first circuit receives the second data from the sensor. The first optical transmitter is configured to transmit the first data as the first optical data.

In other features, the first optical receiver is configured to receive the second optical data. The controller is configured to generate a third data based on the second data to control one or more heaters disposed in the substrate support assembly. The first optical transmitter is configured to transmit the third data as a third optical data. The second optical receiver is configured to receive the third optical data. The first circuit is configured to obtain the third data from the third optical data and to control the one or more heaters based on the third data.

In other features, the controller is configured to generate a third data to identify a component in the substrate support assembly. The first optical transmitter is configured to transmit the third data as a third optical data. The second optical receiver is configured to receive the third optical data. The first circuit is configured to obtain the third data from the third optical data and to associate the third data with the component.

In other features, the first circuit is configured to receive a third data from a component in the substrate support assembly, the third data identifying the component. The second optical transmitter is configured to transmit the third data as a third optical data. The first optical receiver is configured to receive the third optical data. The controller is configured to obtain the third data from the third optical data and to generate a fourth data based on the third data to control the component. The first optical transmitter is configured to transmit the fourth data as a fourth optical data. The second optical receiver is configured to receive the fourth optical data. The first circuit is configured to obtain the fourth data from the fourth optical data and to control the component based on the fourth data.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 shows a schematic representation of the processing chamber and other components of a substrate processing system including an optical power transmission system;

FIG. 4 shows an optical to electrical energy conversion system;

In the drawings, reference numbers may be reused to identify similar and/or identical elements.

DETAILED DESCRIPTION

The present disclosure provides systems and methods for supplying DC power to control electronics circuitry in an electrostatic chuck (ESC) in a plasma chamber and performing bidirectional data communication with sensors and other components in the ESC via a single optical fiber. Using optical fiber eliminates bulky, expensive, and difficult-to-service RF filters and copper cables that are otherwise used between the ESC and power supplies and user interfaces (UIs) located outside the processing chambers. The problems solved and solutions provided by the systems and methods of the present disclosure are described below in detail.

Figure 1:
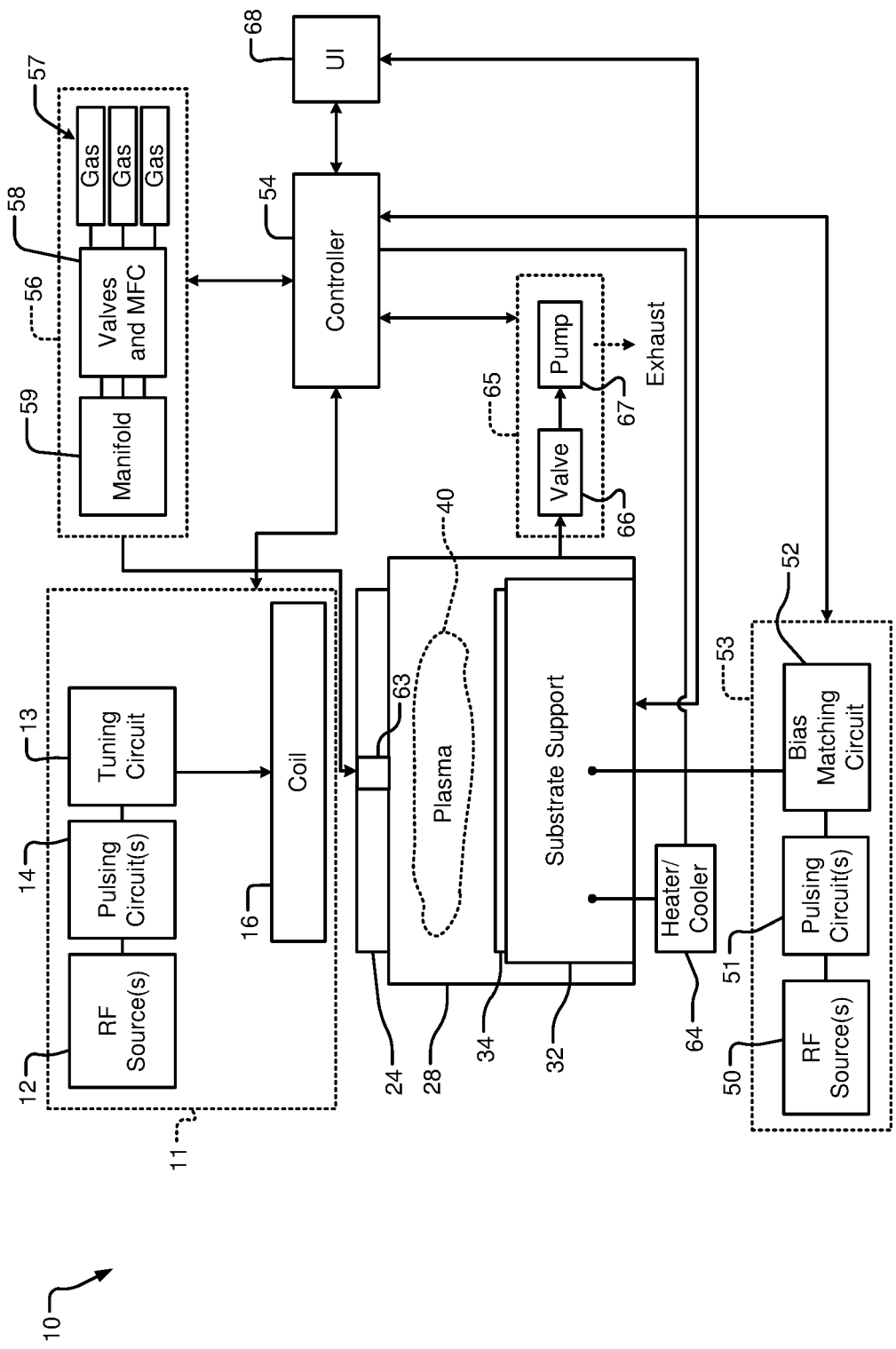
FIG. 1 is a functional block diagram of a substrate processing system comprising a processing chamber that uses inductively coupled plasma to etch substrates such as semiconductor wafers.
Figure 5:
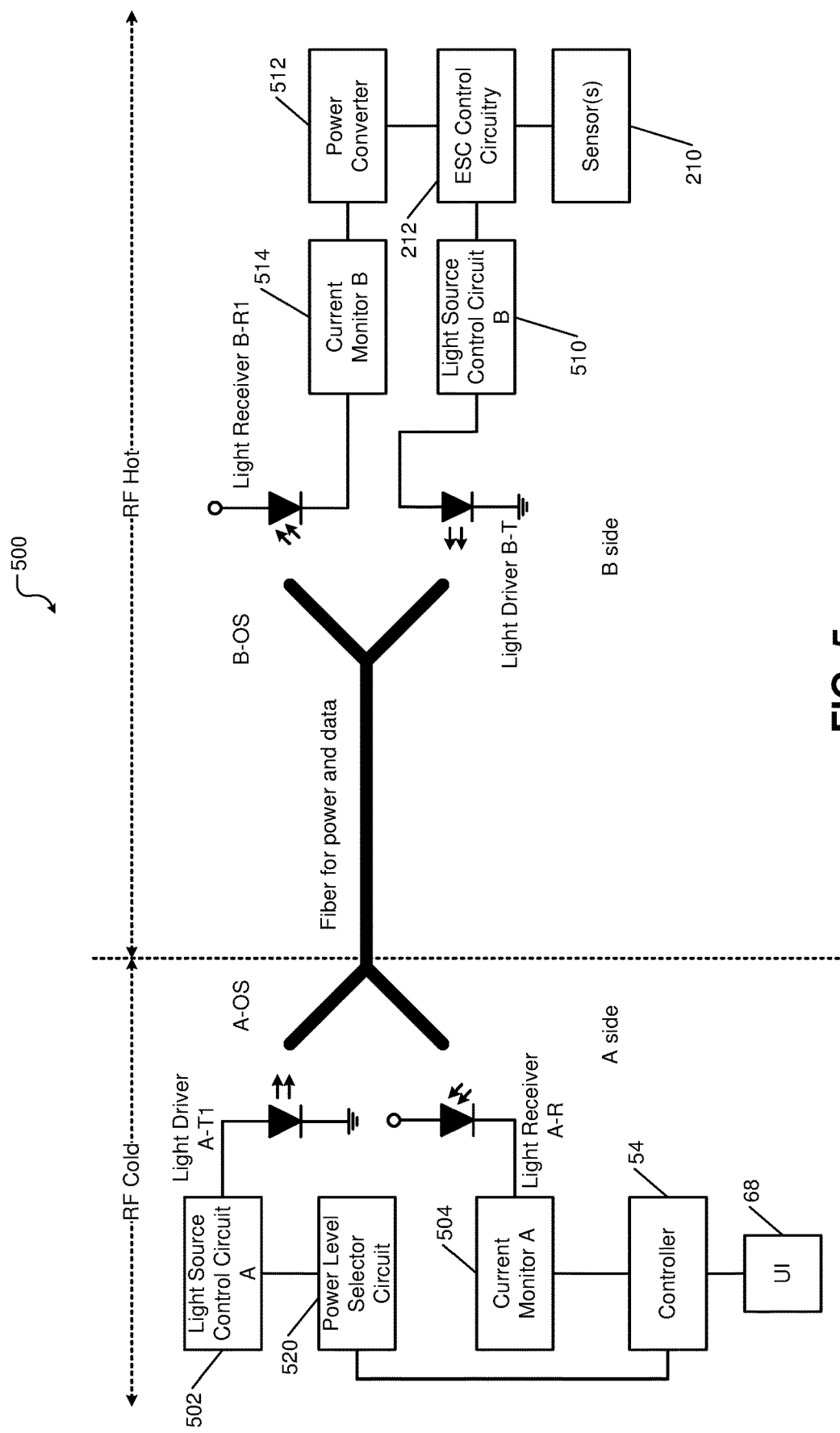
FIG. 5 shows a system for performing power transmission and bi-directional data communication over a single fiber optic cable that can be implemented in the substrate processing system of FIG. 1.

The present disclosure is organized as follows. Before describing the systems and methods of the present disclosure, an example of a substrate processing system and a processing chamber where the systems and methods can be implemented is shown and described with reference to FIG. 1. The problems solved by the systems and methods of the present disclosure are described using a schematic representation of the processing chamber and other components of the substrate processing system shown in FIG. 2. The solutions provided by the systems and methods of the present disclosure are described using a schematic representation of the processing chamber and other components of the substrate processing system shown in FIGS. 3 and 4. A system for performing power transmission and bi-directional data communication over a single fiber optic cable that can be implemented in the substrate processing system of FIG. 1 is shown and described with reference to FIG. 5. Four different modes of operation of the system shown in FIG. 5 are shown and described with reference to FIGS. 6-13. A method for performing power transmission and bi-directional data communication over a single fiber optic cable that can be implemented in the substrate processing system of FIG. 1 is shown and described with reference to FIG. 14. Several methods of operating the system shown in FIG. 5 in four different modes are shown and described with reference to FIGS. 15-18.

FIG. 1 shows an example of a substrate processing system 10 according to the present disclosure. The substrate processing system 10 includes a coil driving circuit 11. In some examples, the coil driving circuit 11 includes an RF source 12, a pulsing circuit 14, and a tuning circuit (i.e., matching circuit) 13. The pulsing circuit 14 controls a transformer coupled plasma (TCP) envelope of an RF signal generated by the RF source 12 and varies a duty cycle of TCP envelope between 1% and 99% during operation. As can be appreciated, the pulsing circuit 14 and the RF source 12 can be combined or separate.

The tuning circuit 13 may be directly connected to an inductive coil 16. While the substrate processing system 10 uses a single coil, some substrate processing systems may use a plurality of coils (e.g., inner and outer coils). The tuning circuit 13 tunes an output of the RF source 12 to a desired frequency and/or a desired phase, and matches an impedance of the coil 16.

A dielectric window 24 is arranged along a top side of a processing chamber 28. The processing chamber 28 further comprises a substrate support (or pedestal) 32 to support a substrate 34. The substrate support 32 may include an electrostatic chuck (ESC), or a mechanical chuck or other type of chuck. Process gas is supplied to the processing chamber 28 and plasma 40 is generated inside of the processing chamber 28. The plasma 40 etches an exposed surface of the substrate 34. An RF power supply 53 including an RF source 50, a pulsing circuit 51, and a bias matching circuit 52 may be used to bias the substrate support 32 during operation to control ion energy.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas injector 63 may be arranged at a center of the dielectric window 24 and is used to inject gas mixtures from the gas delivery system 56 into the processing chamber 28. Additionally or alternatively, the gas mixtures may be injected from the side of the processing chamber 28.

A heater/cooler 64 may be used to heat/cool the substrate support 32 to a predetermined temperature. An exhaust system 65 includes a valve 66 and pump 67 to control pressure in the processing chamber and/or to remove reactants from the processing chamber 28 by purging or evacuation.

A controller 54 may be used to control the etching process. The controller 54 monitors system parameters and controls delivery of the gas mixture; striking, maintaining, and extinguishing the plasma; removal of reactants; supply of cooling gas; and so on. Additionally, as described below, the controller 54 may control various aspects of the coil driving circuit 10, the RF source 50, and the bias matching circuit 52, and so on.

A user interface (UI) 68 may interface with the controller 54 and the substrate support 32. The UI 68 can be used to monitor and control the processes performed in the processing chamber 28. For example, the UI 68 can receive data from sensors in the substrate support 32, set process parameters through the controller 54, and so on.

Figure 2:
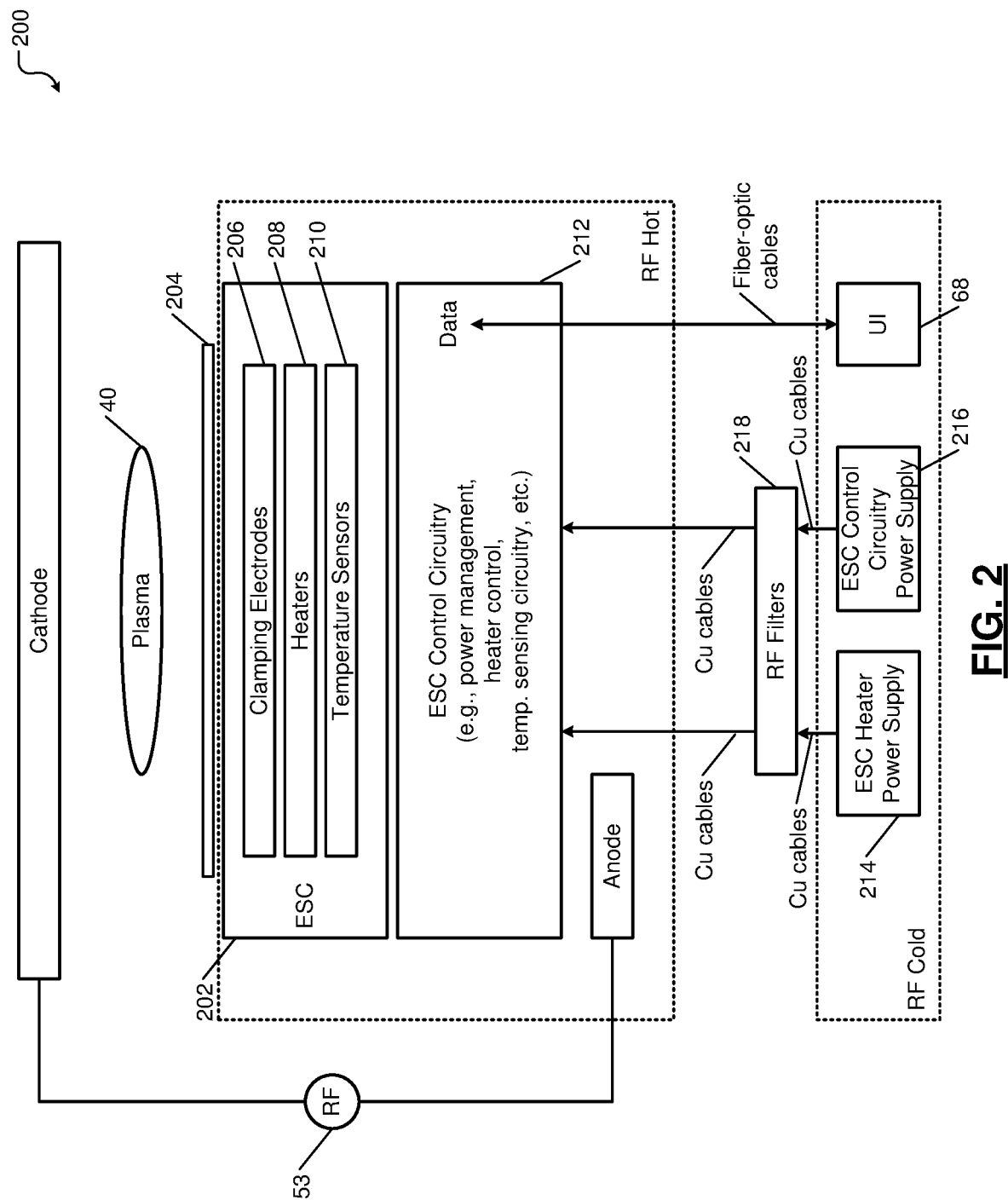
FIG. 2 shows a schematic representation of the processing chamber and other components of the substrate processing system of FIG. 1.

FIG. 2 shows a schematic representation of a processing chamber 200 (e.g., the processing chamber 28 of FIG. 1) and other components (e.g., power supplies and UI) of a substrate processing system (e.g., the system 10 of FIG. 1). For example, the processing chamber 200 comprises an ESC 202 that supports the substrate 204. The ESC 202 comprises one or more clamping electrodes 206, one or more heaters 208, and one or more temperature sensors 210. The processing chamber 200 further comprises control circuitry 212 for power management, heater control, and temperature sensing. A heater power supply 214 supplies power to the heaters 208 through RF filters 218. A power supply 216 supplies power to the control circuitry 212 through the RF filters 218. The power supplies 214, 216 use separate and often multiple RF filters. A user interface (e.g., the UI 68 of FIG. 1) interfaces with the control circuitry 212. The RF power supply 53 supplies RF power to generate plasma 40.

The RF plasma 40 is used for processing the substrate 204. To enable the processing, a so-called RF Hot environment or region is formed, where very high RF voltage (both in amplitude and frequency) is present during processing. The RF hot region includes assemblies such as an anode, the ESC 202, and the ESC control circuitry 212. Outside of the RF Hot region is a so-called RF Cold environment or region, where the RF voltage is relatively low compared to the RF Hot region during processing. The RF cold region includes assemblies such as system power supplies and controls (e.g., the power supplies 214 and 216, and the UI 68). The power supplied by the power supplies 214, 216 is transmitted to the ESC 202 and the control circuitry 212 through copper cables. The UI 68 communicates with the control circuitry 212 through fiber-optic cables. Fiber-optic cables are generally used for data communication directly across the RF hot and RF cold regions because by nature light is immune to RF interference.

The voltage across the RF hot and RF cold regions can range typically from a few KV to tens of KV in amplitude, and from a few MHz to tens of MHz in frequency. Any copper cables that go across from the RF hot to RF cold regions have to be filtered by the RF filters 218 in order to block any RF pickups by the power supplies 214, 216.

The RF filters 218 present many problems. For example, the RF filters 218 are expensive, bulky (occupying space), and heavy (difficult to service). An RF filter is usually specifically tuned to a specific RF frequency. Applications with different RF frequencies require different RF filters. Also, tuning the RF filters becomes more complicated for multiple RF frequency applications. Further, copper cables that go across from RF cold to RF hot regions have to be managed with great care due to voltage standoffs, and have to be limited to specific routing channels due to RF uniformity considerations.

Accordingly, it is desirable to provide solutions for supplying power and data to the ESC 202 and the ESC control circuitry 212 that are less sensitive to RF than copper cables. It is also desirable to reduce the number of RF filters to make the substrate processing systems less expensive, more compact, lighter, and easy to service.

FIGS. 3 and 4 show a new approach for supplying power and data to the ESC and ESC control circuitry that is less sensitive to RF than copper cables. FIG. 3 shows a schematic representation of a processing chamber 300 and other components (e.g., power supplies and UI) of a substrate processing system that differs from the processing chamber 200 of FIG. 2 as follows.

In FIG. 3, the RF cold region includes a light source 302, which replaces the power supply 216. The light source 302 injects light onto a fiber-optic cable 304 that goes across the RF cold region to the RF hot region. The light source 302 can be a general LED or a laser diode (see FIG. 4) depending on power density requirements. The RF hot region includes an optical power converter 306 that converts the optical energy transmitted by the light source 302 over the fiber-optic cable 304 into electricity, which is typically a DC voltage with a few volts of amplitude, and which is sufficient to power the ESC control circuitry 212. The optical power converter 306 can be a specialized photonic converter or a general photodiode (see FIG. 4) depending on the conversion efficiency. The ESC control circuitry 212 in the RF hot region is powered by the optical power converter 306.

The new approach shown in FIGS. 3 and 4 provides many benefits. For example, as compared to the RF filters 218 of FIG. 2, the RF filter 219 of FIG. 3 has fewer channels and is therefore less expensive, more compact, and lighter than the RF filters 218 of FIG. 2. Further, the optical power transmission system shown in FIG. 3 comprising the light source 302, the fiber-optic cable 304, and the optical power converter 306 is independent of RF frequency or amplitude. Therefore, any RF frequency/amplitude changes made in the RF power supply 53 do not require redesign of the optical power transmission system. The redesign or tuning of the conventional RF filter become less demanding. Further, when routing a fiber-optic cable from the RF cold region to the RF hot region, voltage standoff and routing locations are immaterial due to zero RF uniformity impact. The new approach provides better reliability due to fewer cable counts and fewer connection points as compared to the system shown in FIG. 2.

Transmitting both power and data between RF hot and RF cold regions over one single fiber optic cable is possible for some applications and is attractive for both engineering and tool manufacturing. The new approach is not limited to the ESC control application, which is provided and described for example only. Rather, the new approach can be used for powering and communicating with devices such as high voltage current sensors, E-field and H-field probes, and wireless sensors in RF hot regions. Many other applications and use cases of the new approach are contemplated.

FIG. 5 shows a schematic representation of a system 500 for power transmission and bi-directional data communication over a single fiber optic cable between RF cold and hot regions according to the present disclosure. FIG. 5 shows relevant portions of an ESC and relevant components of the substrate processing system as described below. FIGS. 6-13 show four modes of operation of the system 500. FIGS. 6-13 omit some of the elements of the system 500 shown in FIG. 5 for brevity. However, it is understood that all of the elements of the system 500 shown in FIG. 5 are present in FIGS. 6-13.

In FIG. 5, the system 500 comprises an RF cold region (also called A side or master) and an RF hot region (also called B side or slave). The A side comprises a light source control circuit A 502 coupled to a light driver A-T1, which is coupled to a first port of an optical splitter A-OS. The light source control circuit A 502 can supply power to the light driver diode A-T1 at two different power levels A-LP1 and A-LP2. A second port of the optical splitter A-OS is coupled to a light receiver A-R. A current sensor or current monitor A 504 monitors current through the light receiver A-R for data transmission and self-diagnostic needs, which is explained below with reference to FIGS. 6-18. A third port of the optical splitter A-OS is coupled to a fiber optic cable, which connects to another light driver and receiver via another optical splitter on B-side.

The B side comprises a light source control circuit B 510 coupled to a light driver B-T, which is coupled to a first port of an optical splitter B-OS. The light source control circuit B 510 has a single power level B-LP, which differs from the power levels A-LP1 or A-LP2 of the light source control circuit A 502. A second port of the optical splitter B-OS is coupled to a light receiver B-R1. Current through the light receiver B-R1 stimulates (i.e., activates or drives) a power converter (e.g., an optical power conversion device) 512 or can charge an energy storage device (e.g., a capacitor). The power converter 512 supplies power to the ESC control circuitry 212 and/or one or more of the sensors 210. In parallel with the power conversion, a current sensor or current monitor B 514 monitors current through the light receiver B-R1 for data transmission and self-diagnostic needs, which is explained below with reference to FIGS. 6-18. A third port of the optical splitter B-OS is coupled to the fiber optic cable, which connects to the A side via the optical splitter A-OS.

On the A side, a power level selector circuit 520 selects the power level of the light source control circuit A 502. For example, the controller 54 controls the power level selector circuit 520 during data transmission from side A to side B in operating modes 2 and 4 as explained below with reference to FIGS. 8-9 and 12-13. The power level selector circuit 520 sets the power level of the light source control circuit A 502 according to an input received from the controller 54. The power level of the light source control circuit B 510 may be similarly set to zero or B-LP when transmitting data from side B to side A in operating modes 3 and 4 as explained below with reference to FIGS. 10-13.

Figure 6:
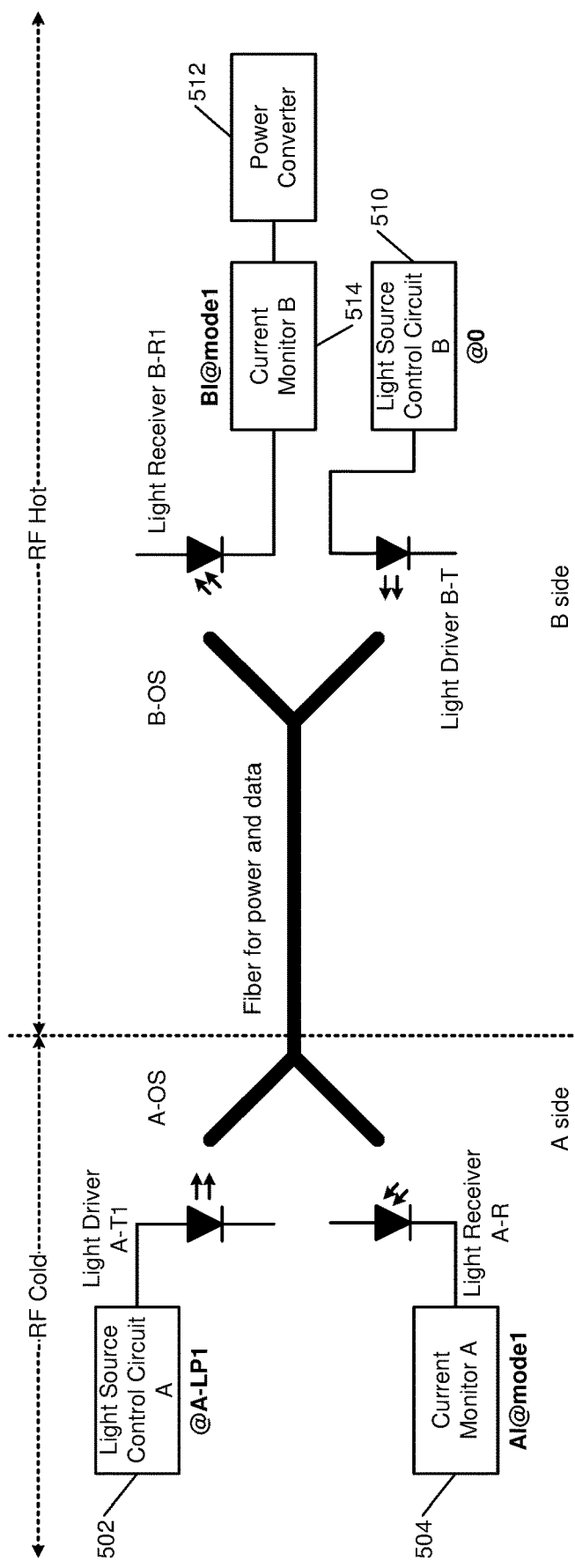
FIGS. 6 and 7 show a first operating mode (Mode 1) of the system of FIG. 5.
Figure 7:
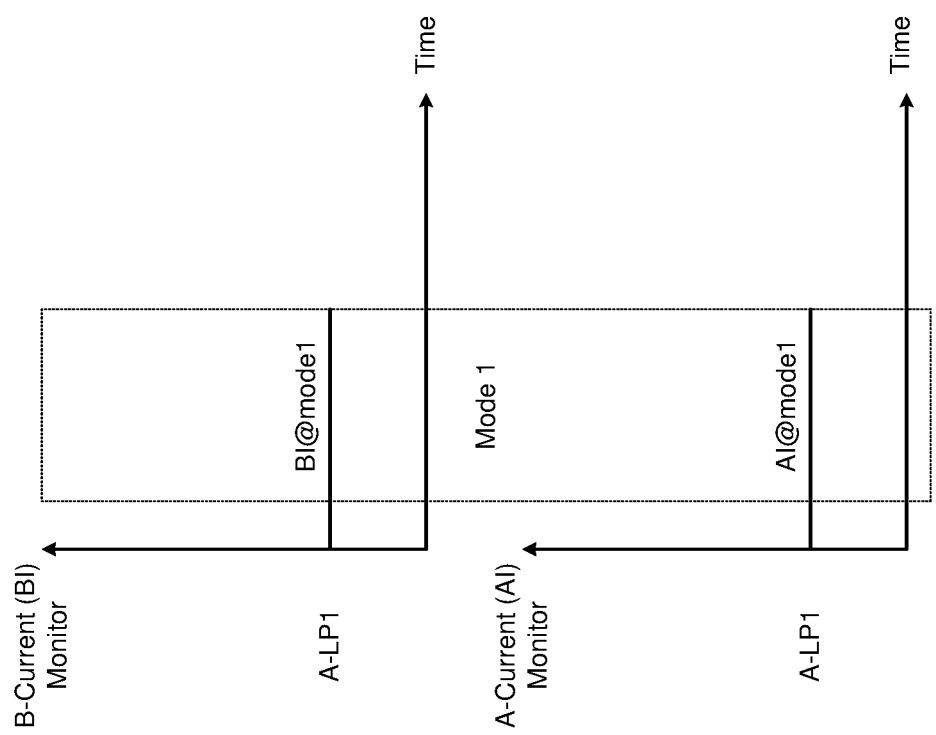

FIGS. 6 and 7 show a first operating mode (Mode 1) of the system 500. In Mode 1, power is transmitted from side A to side B as follows. The power level selector circuit 520 sets the power level of the light source control circuit A 502 to A-LP1. The light driver A-T1 transmits light according to the power level A-LP1 of the light source control circuit A 502. The power level of the light source control circuit B 510, B-LP, is set to zero. Accordingly, the light driver B-T does not transmit light in Mode 1.

Due to the optical splitters, the light receiver A-R receives some of the light transmitted by the light driver A-T1. The current monitor A 504 senses the current through the light receiver A-R denoted by AI@mode1. This value of current (AI@mode1) sensed through the light receiver A-R when only the light driver A-T1 transmits light serves two purposes: (1) AI@mode1 provides a baseline current to be used in data transmission modes; (2) self-diagnostics: when the value is not at an expected level, which can be determined by calibration, the controller 54 can detect a hardware failure, such as failure of one or more of the light source control circuit A 502, the light driver A-T1, the optical splitter A-OS, the light receiver A-R, and/or the current monitor A 504 itself.

Due to the optical splitters, the light receiver B-R1 receives some of the light transmitted by the light driver A-T1. Based on the light received by the light receiver B-R1, the power converter 512 converts the optical energy into the electrical energy with which to power the ESC control circuitry 212 and/or one or more of the sensors 210. The current monitor B 514 senses the current through the light receiver B-R1 denoted by BI@mode1. This value of current (BI@mode1) sensed through light receiver B-R1 when only the light driver A-T1 transmits light also serves dual purposes similar to those described above with reference to the current AI@mode1. FIG. 7 shows the currents BI@mode1 and AI@mode1 that respectively flow through the light receivers B-R1 and A-R when only the light driver A-T1 transmits light at power A-LP1.

Figure 8:
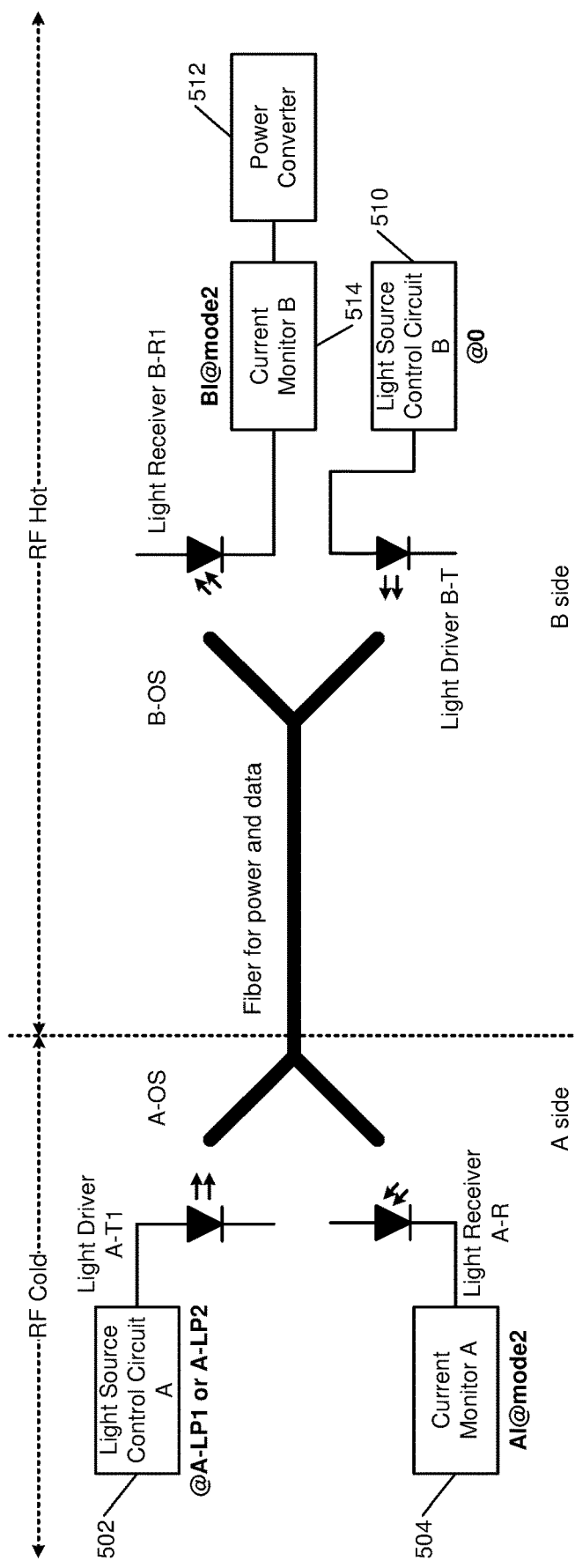
FIGS. 8 and 9 show a second operating mode (Mode 2) of the system of FIG. 5.
Figure 9:
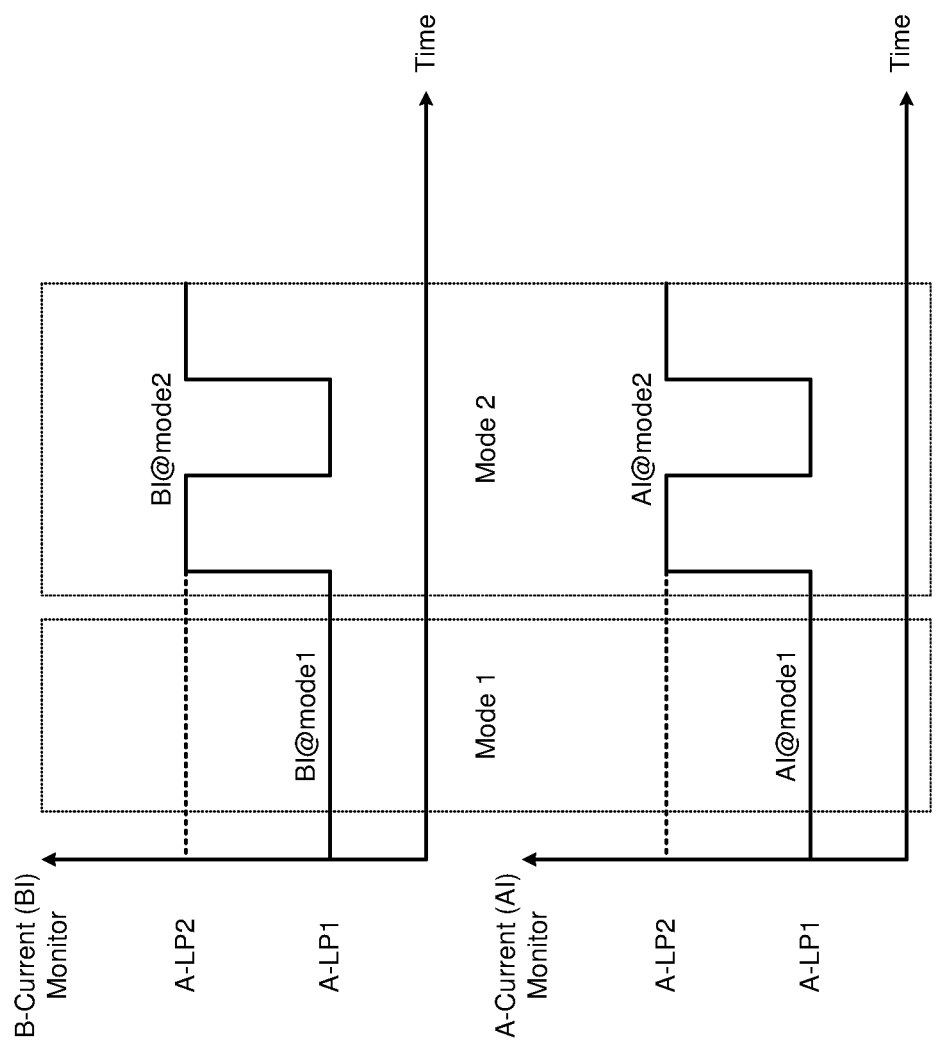

FIGS. 8 and 9 show a second operating mode (Mode 2) of the system 500. In Mode 2, power and data are transmitted from side A to side B as follows. To transmit power from side A to side B, the power level selector circuit 520 sets the power level of the light source control circuit A 502 to A-LP1. The light driver A-T1 transmits light according to the power level A-LP1 of the light source control circuit A 502. The power level of the light source control circuit B 510, B-LP, is set to zero. Accordingly, as in Mode 1, the light driver B-T does not transmit light in Mode 2. The remaining operations for power transmission from side A to side B are similar to those in Mode 1 described above with reference to FIGS. 6 and 7.

To transmit data from side A to side B, the power level selector circuit 520 toggles the power level setting of the light source control circuit A 502 between power levels A-LP1 and A-LP2 depending data to be transmitted. For example, the power level A-LP1 is selected to transmit a 0, and the power level A-LP2 is selected to transmit a 1. The power level A-LP2 may be greater than the power level A-LP1. The light driver A-T1 transmits light according to the selected power level of the light source control circuit A 502. The power level of the light source control circuit B 510, B-LP, is set to zero. Accordingly, as in Mode 1, the light driver B-T does not transmit light in Mode 2.

Due to the optical splitters, the light receiver A-R receives some of the light transmitted by the light driver A-T1 during data transmission from side A to side B. The current monitor A 504 senses the current through the light receiver A-R denoted by AI@mode2. Beside hardware monitoring (by checking whether AI@mode2 is at expected level), the data sent from side A to side B is also received by side A (in the form of light received by the receiver A-R when the light driver A-T1 transmits data). Since A-LP2>A-LP1, AI@mode2>=AI@mode1, data sent from A side to B side can be expressed as AI@mode2−AI@mode1. This echoed data can be used (e.g., by the controller 54) to confirm whether side A indeed sends the correct data or not.

Due to the optical splitters, the light receiver B-R1 receives some of the light transmitted by the light driver A-T1. Based on the light received by the light receiver B-R1, the power converter 512 converts the optical energy into the electrical energy with which to power the ESC control circuitry 212 and/or one or more of the sensors 210. The current monitor B 514 senses the current through the light receiver B-R1 denoted by BI@mode2. Data received from the A side on the B side is detected as data=BI@mode2−BI@mode1. If the data is less than a predetermined threshold, the data received is a 0, otherwise a 1.

Note that the power converter 512 continues the optical power conversion while the B side receives data from the A side, which obviates the need for storing power received from the A side during power transmission. FIG. 9 shows the currents through the light receivers B-R1 and A-R in Mode 2.

Figure 10:
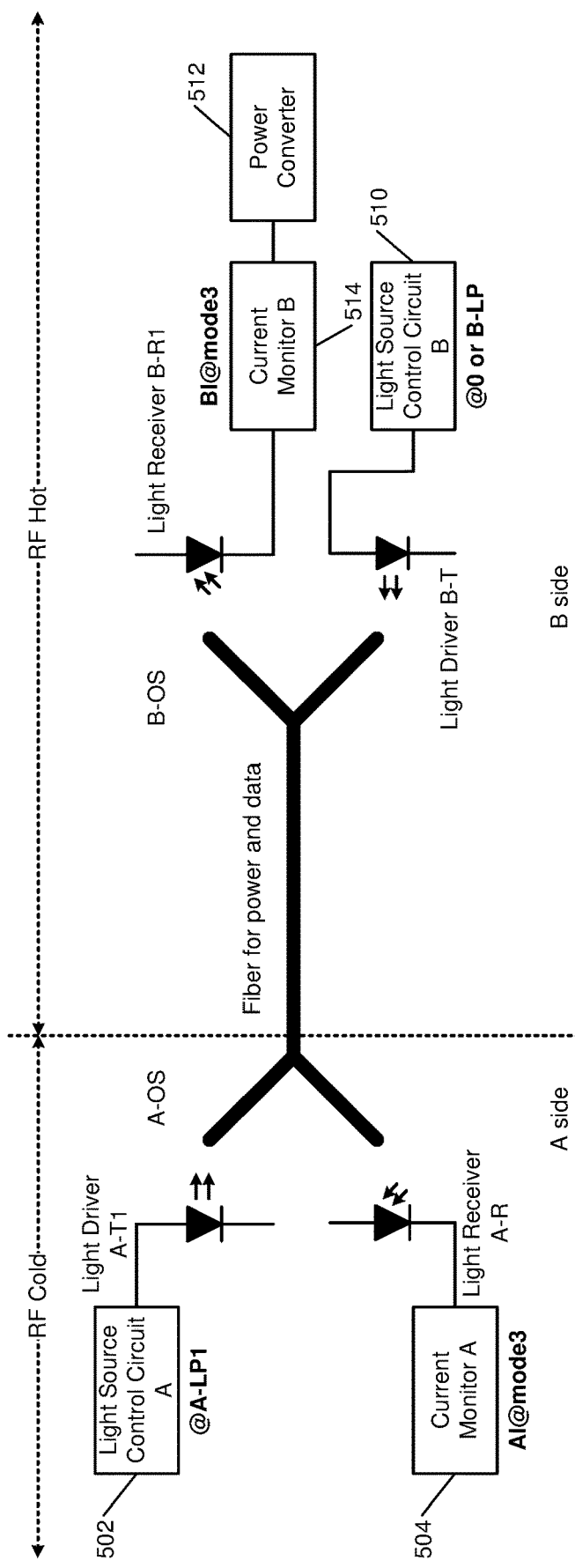
FIGS. 10 and 11 show a third operating mode (Mode 3) of the system of FIG. 5.
Figure 11:
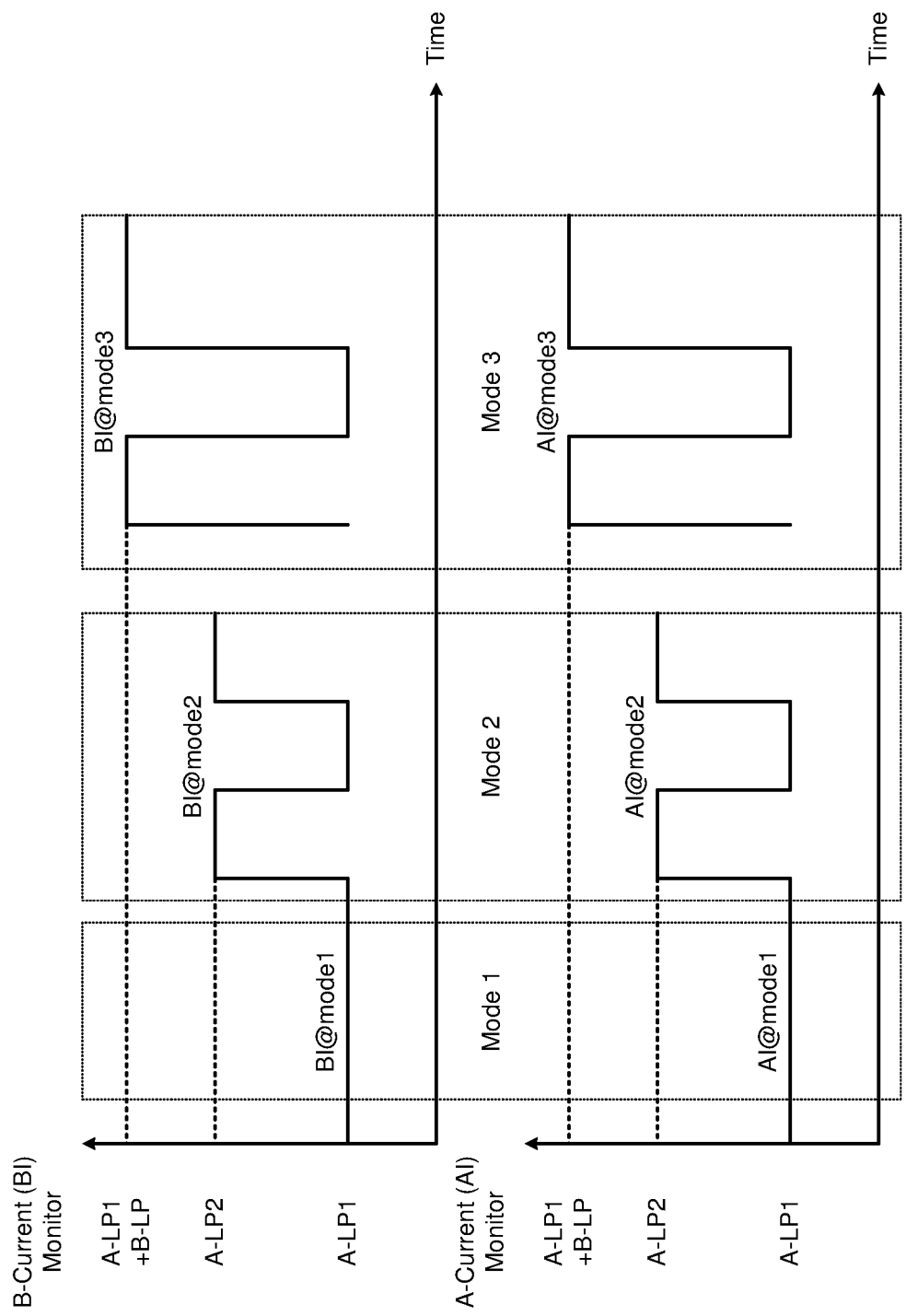

FIGS. 10 and 11 show a third operating mode (Mode 3) of the system 500. In Mode 3, power is transmitted from side A to side B, and data is transmitted from side B to side A as follows. To transmit power from side A to side B, the power level selector circuit 520 sets the power level of the light source control circuit A 502 to A-LP1. The light driver A-T1 transmits light according to the power level A-LP1 of the light source control circuit A 502.

To transmit data from side B to side A, the light source control circuit B 510 toggles between power levels of zero and B-LP depending data to be transmitted. For example, the power level is zero when a 0 is transmitted, and the power level is B-LP when a 1 is transmitted. The light driver B-T transmits light according to the power level of the light source control circuit B 510. The light transmitted by the light driver B-T toggles between two levels: light and no light when transmitting 1 and 0, respectively.

Due to the optical splitters, when side B transmits data, the light receiver A-R receives the light from the light driver B-T and the constant reflected light from the light driver A-T1, which continues to transmit power from side A to side B whether or not side B transmits data to side A. The current monitor A 504 senses the current through the light receiver A-R denoted by AI@mode3. In order to distinguish AI@mode3 from AI@mode2, the power level B-LP needs to be different from the power level A-LP2. Suppose that B-LP>A-LP2. When the current monitor A 504 detects AI@mode3>AI@mode2, the data is from side B (rather than the echoed data from side A). The quantization of the difference (AI@mode3−AI@mode1) is interpreted as the data received from side B.

Due to the optical splitters, the light receiver B-R1 receives some of the light transmitted by the light driver A-T1. In addition, when side B transmits data to side A, the light receiver B-R1 also receives some of the light transmitted by the light driver B-T. Based on all of the light received by the light receiver B-R1, the power converter 512 converts the optical energy into the electrical energy with which to power the ESC control circuitry 212 and/or one or more of the sensors 210. The current monitor B 514 senses the current through the light receiver B-R1 denoted by BI@mode3, which can be used for self-diagnostic purposes.

Note that as in Modes 1 and 2, the power converter 512 continues the optical power conversion while the B side transmits data from the A side in Mode 3, which obviates the need for storing power received from the A side. FIG. 11 shows the currents through the light receivers B-R1 and A-R in Mode 3.

Figure 12:
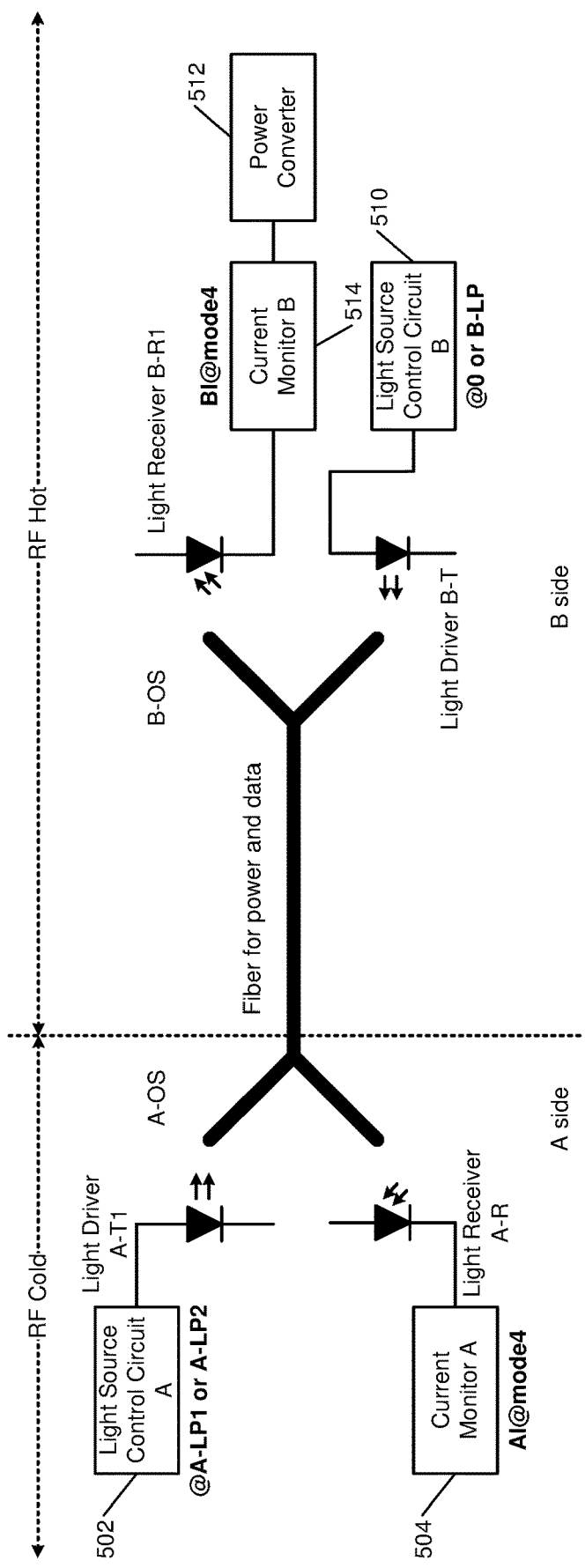
FIGS. 12 and 13 show a fourth operating mode (Mode 4) of the system of FIG. 5.
Figure 13:
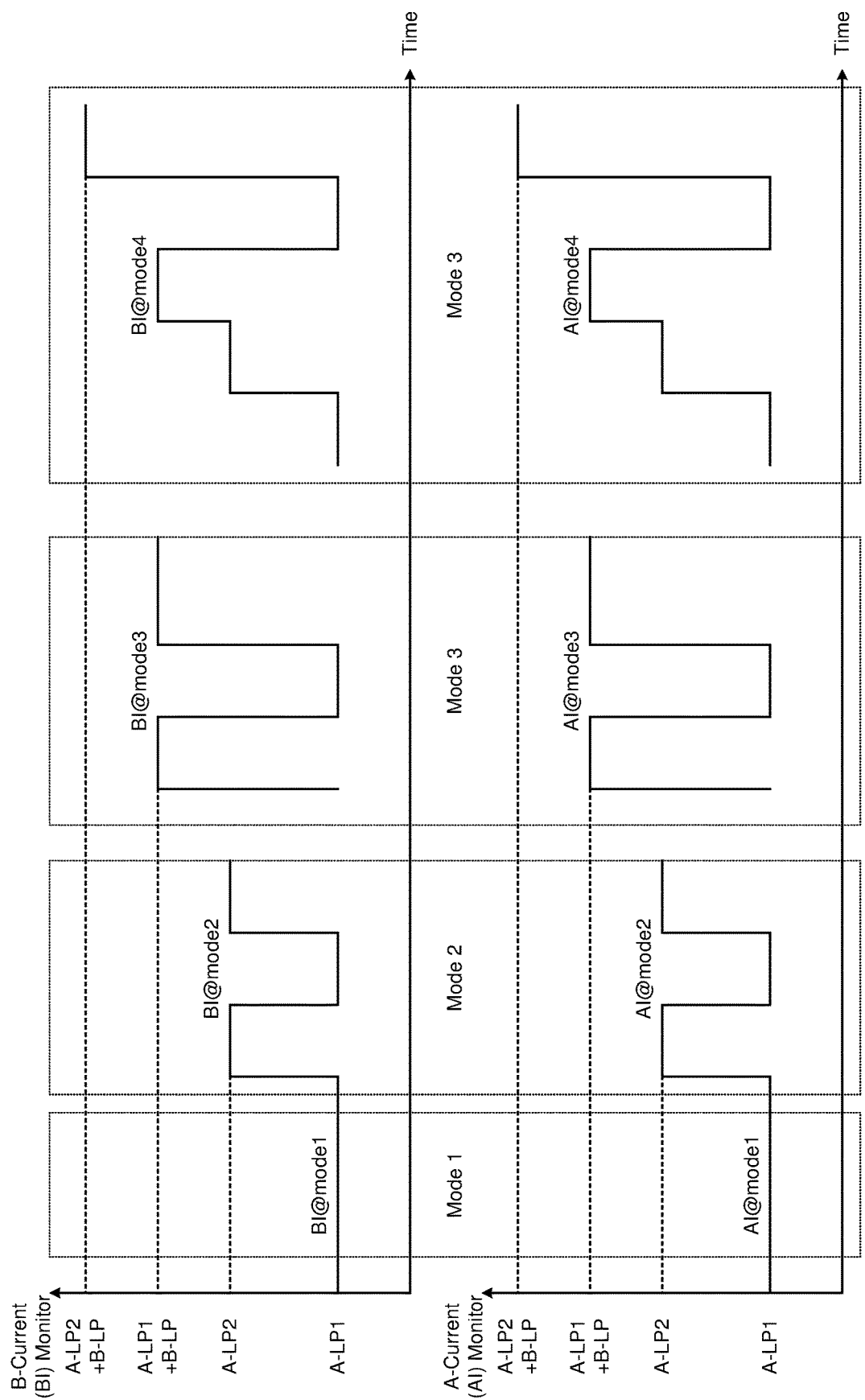

FIGS. 12 and 13 show a fourth operating mode (Mode 4) of the system 500. In Mode 4, power and data are transmitted from side A to side B, and data is transmitted from side B to side A, simultaneously, as follows.

To transmit power from side A to side B, the power level selector circuit 520 sets the power level of the light source control circuit A 502 to A-LP1. The light driver A-T1 transmits light according to the power level A-LP1 of the light source control circuit A 502.

To transmit data from side A to side B, the power level selector circuit 520 toggles the power level setting of the light source control circuit A 502 between power levels A-LP1 and A-LP2 depending data to be transmitted. For example, the power level A-LP1 is selected to transmit a 0, and the power level A-LP2 is selected to transmit a 1. The power level A-LP2 may be greater than the power level A-LP1. The light driver A-T1 transmits light according to the selected power level of the light source control circuit A 502.

To transmit data from side B to side A, the light source control circuit B 510 toggles between power levels of zero and B-LP depending data to be transmitted. For example, the power level is zero when a 0 is transmitted, and the power level is B-LP when a 1 is transmitted. The light driver B-T transmits light according to the power level of the light source control circuit B 510. The light transmitted by the light driver B-T toggles between two levels: light and no light when transmitting 1 and 0, respectively.

Due to the optical splitters, the light receiver A-R receives some of the light transmitted by the light driver A-T1 as well as the light transmitted by the light driver B-T. The current monitor A 504 senses the current through the light receiver A-R denoted by AI@mode4. The light receiver B-R1 receives some of the light transmitted by the light driver A-T1. In addition, the light receiver B-R1 also receives some of the light transmitted by the light driver B-T. Based on all of the light received by the light receiver B-R1, the power converter 512 converts the optical energy into the electrical energy with which to power the ESC control circuitry 212 and/or one or more of the sensors 210. The current monitor B 514 senses the current through the light receiver B-R1 denoted by BI@mode4.

FIG. 13 shows the currents through the light receivers B-R1 and A-R in Mode 4. The A and B current monitors 504, 514 detect currents due to light transmitted at four different power levels A-LP1, A-LP1+B-LP, A-LP2, A-LP2+B-LP from both sides A and B. Note that the power converter 512 always receives light and always continues the optical power conversion, which obviates the need for storing power received from the A side.

Many applications can use bidirectional communication between A and B sides as described in Mode 4. In some applications, in addition to receiving sensor data from side B as described in Mode 2, data may need to be supplied to the ESC control circuitry 212 as mentioned in Modes 2 and 4. For example, the frequencies at which data is collected from the heaters 208 and/or sensors 210 can be varied depending on the applications. For example, some events in the ESC may be monitored more frequently while other events may be monitored less frequently. Accordingly, side A (master) can send commands to side B (slave) to alter settings, parameters, or configurations in the ESC control circuitry 212 to change the speed of data collection for some events, for example. Based on the data collected from the sensors 210, the controller 54 may send commands to control the heaters 208. Also, side A (master) can write identifying data into one or more components of the ESC (i.e., on side B or slave) for tracking purposes (e.g., when parts of the ESC are swapped). Further, the controller 54 may query identifying data of a component in the ESC and send appropriate data to control the component based on the identifying data of the component received from side B. Many other uses of bi-directional communication between A and B sides are contemplated.

Figure 14:
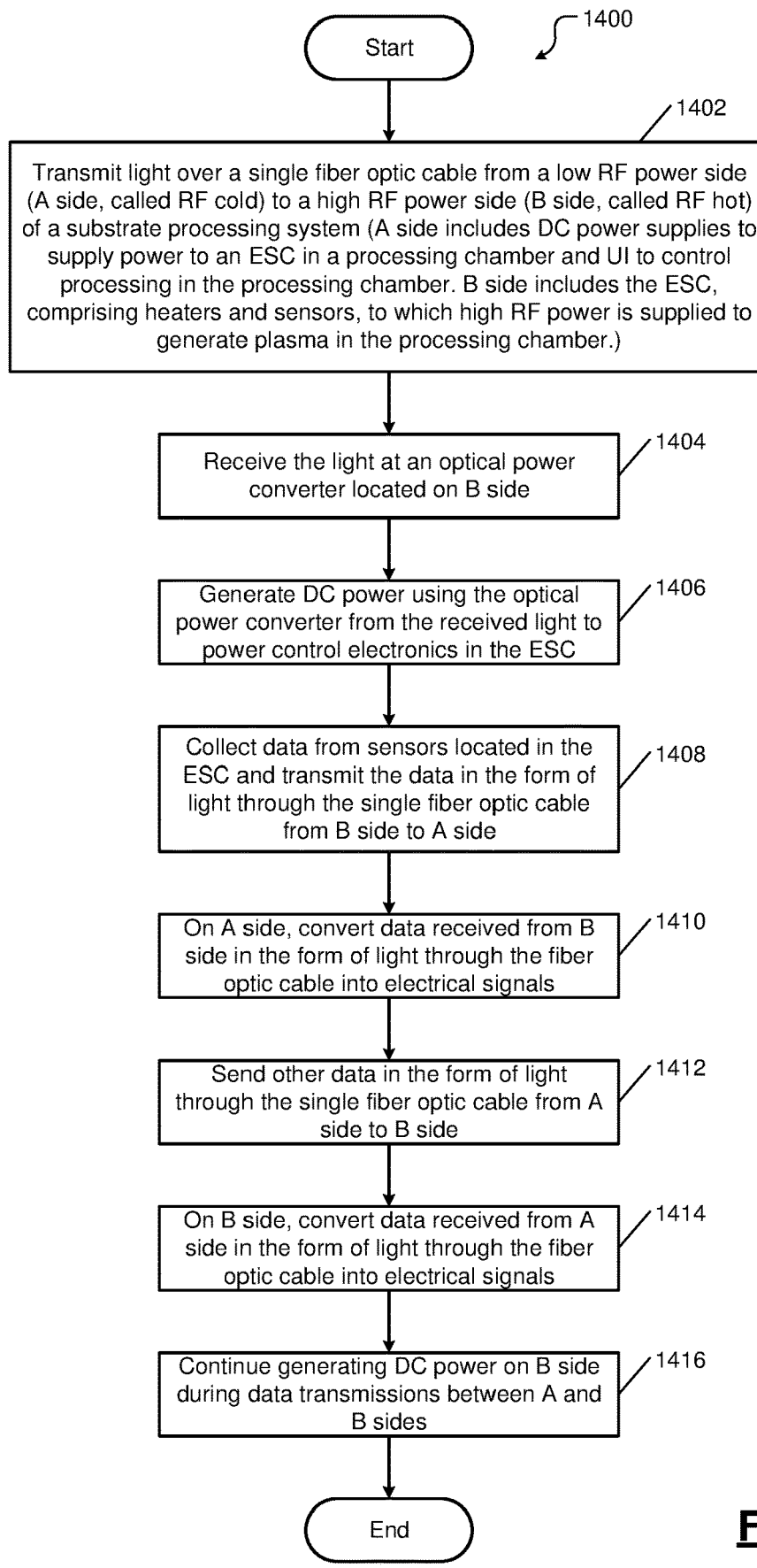
FIG. 14 shows a flowchart of a method performed by the system of FIG. 5.

FIG. 14 shows a method 1400 for power transmission to an ESC from a low RF region of a substrate processing system outside the ESC and for bidirectional data communication between the low RF region and the ESC using a single fiber optic cable between the low RF region and the ESC. The low RF region is also called a low RF power side, A side, or RF cold side of the substrate processing system. The A side includes DC power supplies to supply power to the ESC and also includes the user interface (UI) control processing in a processing chamber comprising the ESC. The B side of the substrate processing system includes the ESC, comprising heaters and sensors, to which high RF power is supplied to generate plasma in the processing chamber. Accordingly, the B side is also called a high RF region, a high RF power side, or RF hot side of the substrate processing system. The A and B sides are also respectively called master and slave.

At 1402, the method 1400 transmits light over the single fiber optic cable from A side to B side. At 1404, the method 1400 receives the light at an optical power converter located on side B. At 1406, the method 1400 generates DC power using the optical power converter from the received light to power control electronics in the ESC on B side. At 1408, the method 1400 select data from sensors located in the ESC and transmits the data in the form of light through the single fiber optic cable from B side to A side. At 1410, on A side, the method 1400 converts the data received from B side in the form of light through the fiber-optic cable into electrical signals. At 1412, the method 1400 sends other data in the form of light through the single fiber optic cable from A side to B side. At 1414, on B side, the method 1400 converts the other data received from A side in the form of light through the fiber-optic cable into electrical signals. At 1416, the method 1400 continues to generate DC power on B side during data transmissions between A and B sides.

Figure 15:
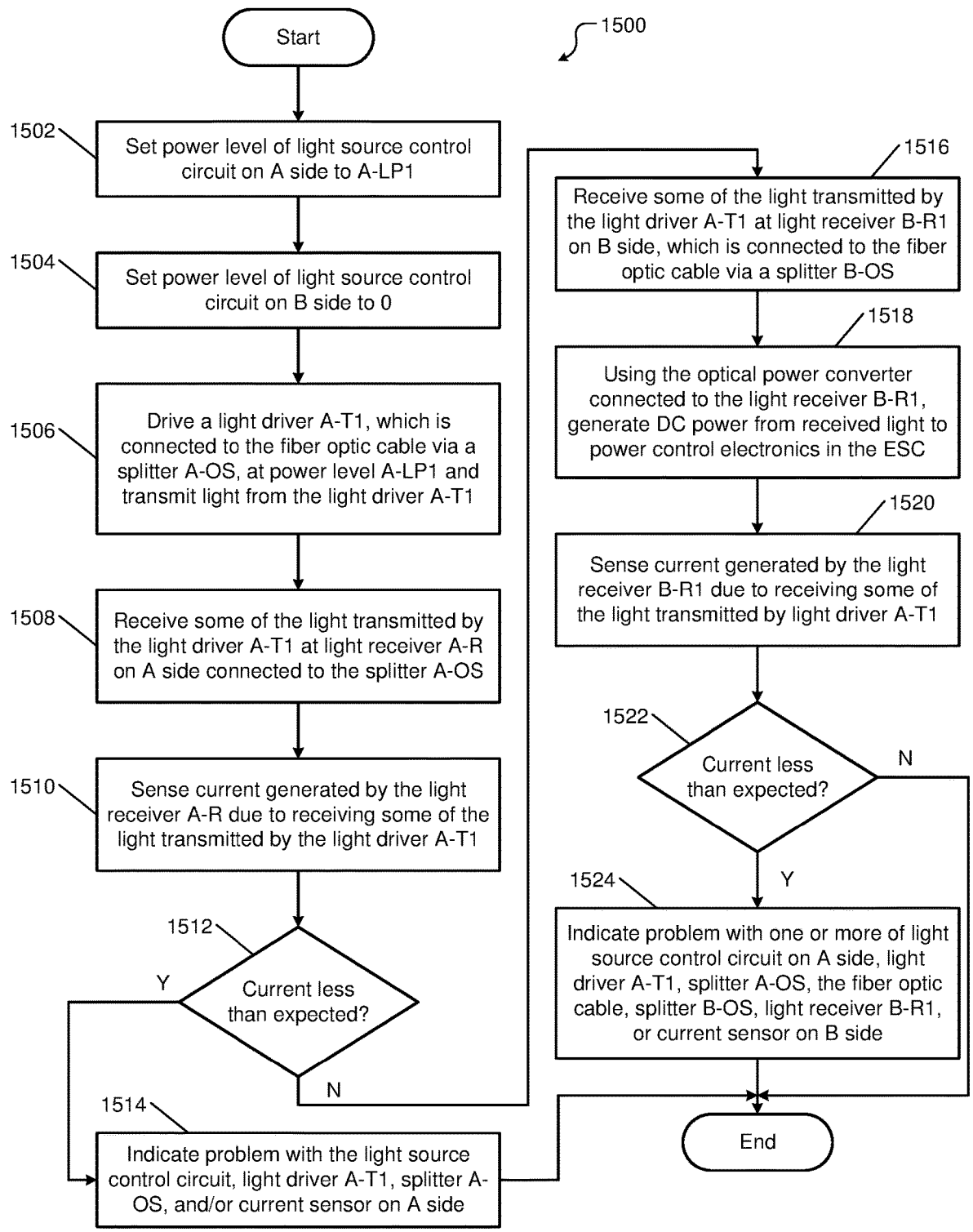
FIG. 15 shows a flowchart of a method performed by the system of FIG. 5 when operating in Mode 1.

FIG. 15 shows a method 1500 for power transmission from A side to B side or from master to slave. At 1502, the method 1500 sets the power level of the light source control circuit on A side to A-LP1. At 1504, the method 1500 sets the power level of the light source control circuit on B side to zero. At 1506, the method 1500 drives the light driver A-T1 on A side based on the power level A-LP1 of the light source control circuit on A side, and transmits light from the light driver A-T1 on A side, which is coupled to the fiber-optic cable via a first port of an optical splitter A-OS on A side.

At 1508, the method 1500 receives some of the light transmitted by the light driver A-T1 at a light receiver A-R on A side, which is coupled to the fiber-optic cable via a second port of the optical splitter A-OS on A side. At 1510, the method 1500 senses current generated by the light receiver A-R due to receiving some of the light transmitted by the light driver A-T1. At 1512, the method 1500 determines whether the sensed current is less than expected. At 1514, if the sensed current is less than expected, the method 1500 indicates a problem with one or more of the light source control circuit on A side, the light driver A-T1, the optical splitter A-OS, or the current sensor on A side; and the method 1500 ends.

At 1516, if the sensed current is not less than expected, the method 1500 receives some of the light transmitted by the light driver A-T1 at a light receiver B-R1 on B side, which is coupled to the fiber-optic cable via a first port of an optical splitter B-OS on B side. At 1518, using an optical power converter connected to the light receiver B-R1, the method 1500 generates DC power from the received light to power control electronics in the ESC.

At 1520, the method 1500 senses current generated by the light receiver B-R1 due to receiving some of the light transmitted by the light driver A-T1. At 1522, the method 1500 determines whether the sensed current is less than expected. At 1524, if the sensed current is less than expected, the method 1500 indicates a problem with one or more of the light source control circuit on A side, the light driver A-T1, the optical splitter A-OS, the fiber-optic cable, the optical splitter B-OS, the light receiver B-R1, or the current sensor on B side. The method 1500 ends if the sensed current is not less than expected.

Figure 16:
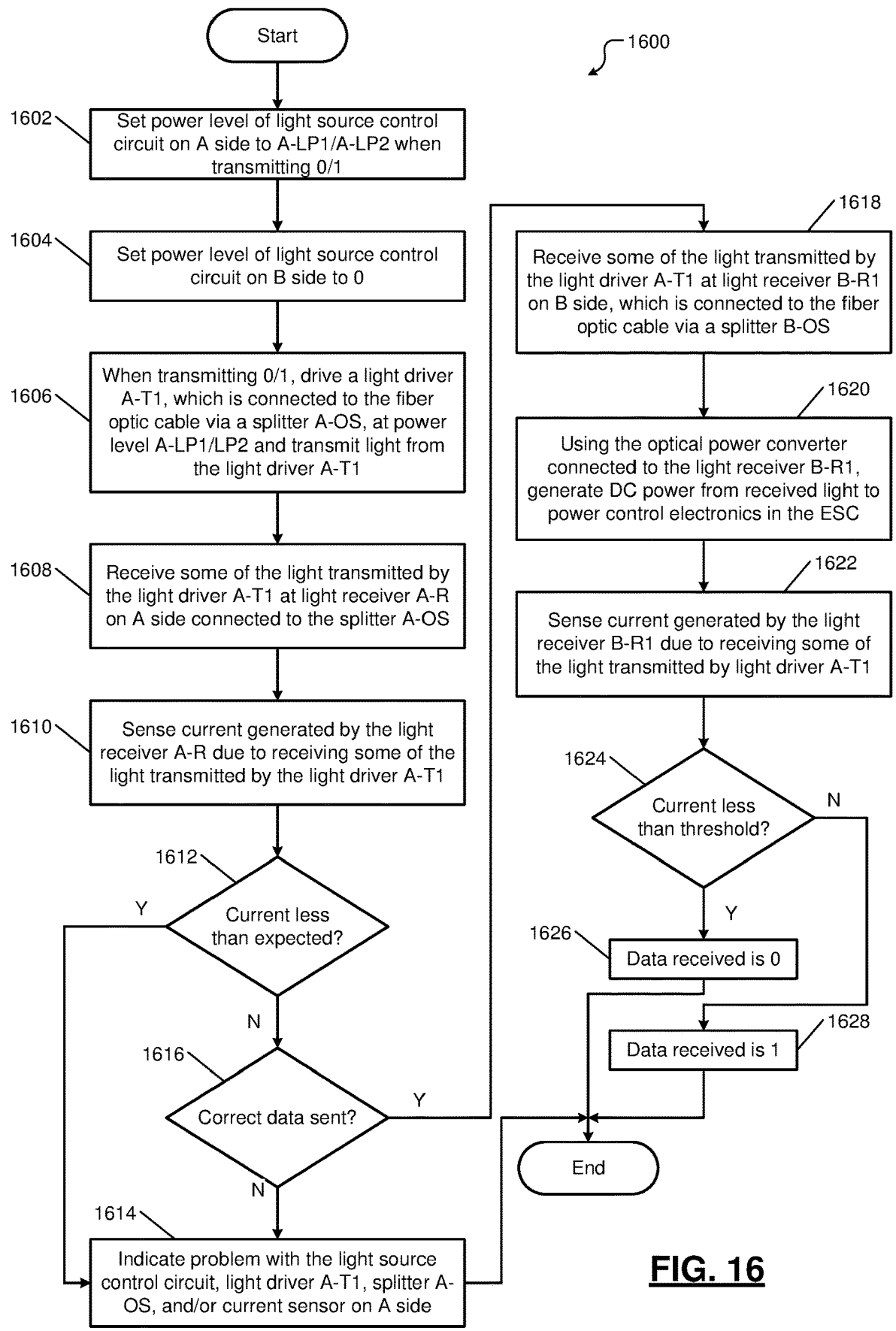
FIG. 16 shows a flowchart of a method performed by the system of FIG. 5 when operating in Mode 2.

FIG. 16 shows a method 1600 for power and data transmission from A side (master) to B side (slave). At 1602, the method 1600 sets the power level of the light source control circuit on A side to A-LP1/A-LP2 when transmitting data digitally as 0/1. At 1604, the method 1600 sets the power level of the light source control circuit on B side to zero. At 1606, depending on the data being transmitted (i.e., whether a 0 or a 1 is being transmitted), the method 1600 drives the light driver A-T1 on A side based on the power level A-LP1 or A-LP2 of the light source control circuit on A side, and transmits light from the light driver A-T1 on A side, which is coupled to the fiber-optic cable via a first port of an optical splitter A-OS on A side.

At 1608, the method 1600 receives some of the light transmitted by the light driver A-T1 at a light receiver A-R on A side, which is coupled to the fiber-optic cable via a second port of the optical splitter A-OS on A side. At 1610, the method 1600 senses current generated by the light receiver A-R due to receiving some of the light transmitted by the light driver A-T1.

At 1612, the method 1600 determines whether the sensed current is less than expected. At 1614, if the sensed current is less than expected, the method 1600 indicates a problem with one or more of the light source control circuit on A side, the light driver A-T1, the optical splitter A-OS, or the current sensor on A side; and the method 1600 ends. At 1616, if the sensed current is not less than expected, the method 1600 determines based on the sensed current weather correct data is transmitted from the light driver A-T1. The method 1600 goes to 1614 if incorrect data is transmitted.

At 1618, if the sensed current is not less than expected at 1612 and if correct data is transmitted at 1616, the method 1600 receives some of the light transmitted by the light driver A-T1 at a light receiver B-R1 on B side, which is coupled to the fiber-optic cable via a first port of an optical splitter B-OS on B side. At 1620, using an optical power converter connected to the light receiver B-R1, the method 1600 generates DC power from the received light to power control electronics in the ESC.

At 1622, the method 1600 senses current generated by the light receiver B-R1 due to receiving some of the light transmitted by the light driver A-T1. At 1624, the method 1600 determines whether the sensed current is less than a predetermined threshold. At 1626, the method 1600 determines that the data received is a 0 if the sensed current is less than the predetermined threshold. At 1628, the method 1600 determines that the data received is a 1 if the sensed current is less than the predetermined threshold.

Figure 17:
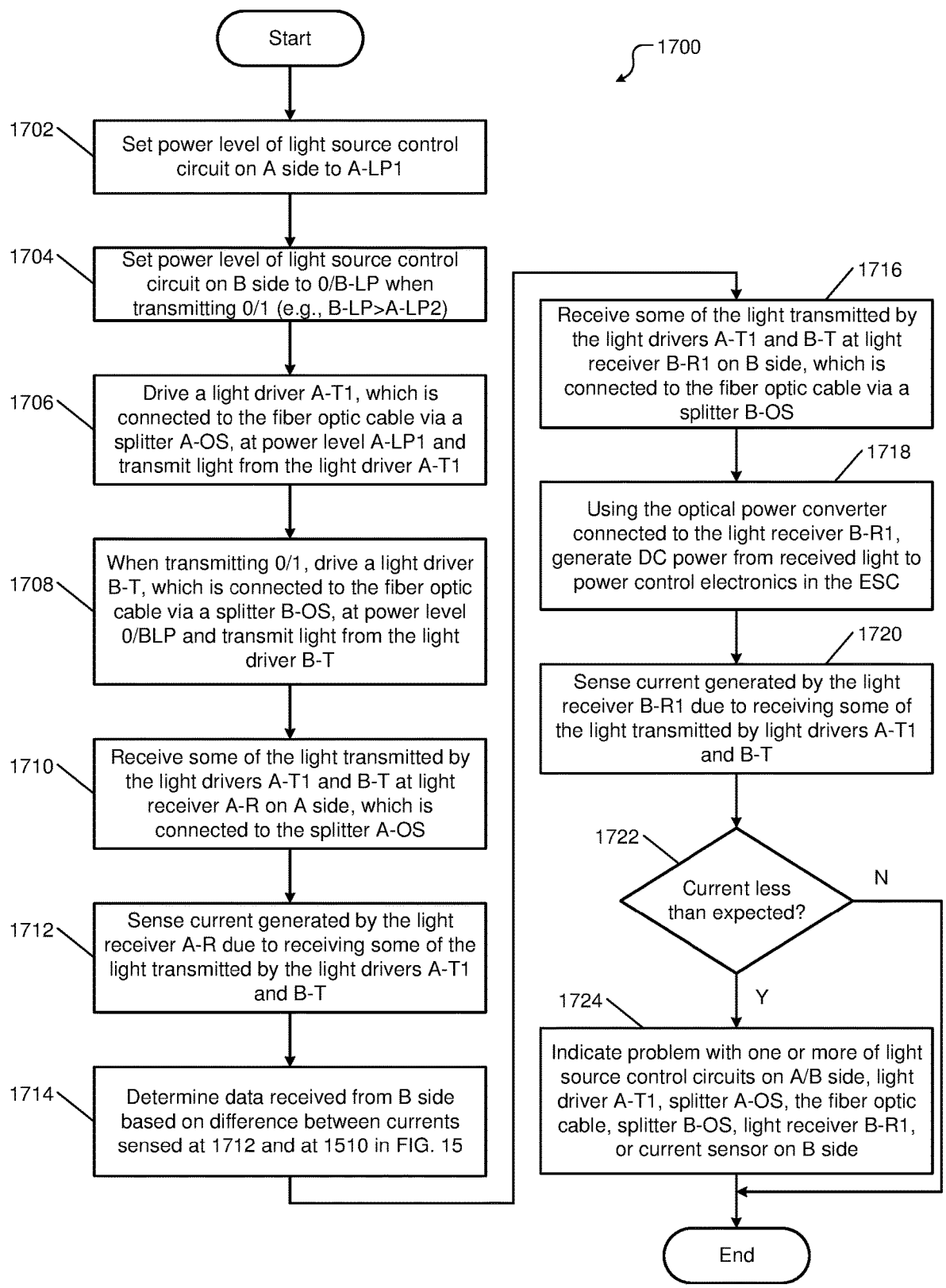
FIG. 17 shows a flowchart of a method performed by the system of FIG. 5 when operating in Mode 3.

FIG. 17 shows a method 1700 for power transmission from A side (master) to B side (slave) and data transmission from B side (slave) to A side (master). At 1702, the method 1700 sets the power level of the light source control circuit on A side to A-LP1. At 1704, the method 1700 sets the power level of the light source control circuit on B side to 0/B-LP when transmitting data digitally as 0/1. For example, B-LP, which needs to different than A-LP2, maybe greater than A-LP2.

At 1706, the method 1700 drives the light driver A-T1 on A side based on the power level A-LP1 of the light source control circuit on A side, and transmits light from the light driver A-T1 on A side, which is coupled to the fiber-optic cable via a first port of an optical splitter A-OS on A side.

At 1708, depending on the data being transmitted (i.e., whether a 0 or a 1 is being transmitted), the method 1700 drives the light driver B-T on B side based on the power level 0 or B-LP of the light source control circuit on B side, and transmits light from the light driver B-T on B side, which is coupled to the fiber-optic cable via a second port of an optical splitter B-OS on B side.

At 1710, the method 1700 receives some of the light transmitted by the light drivers A-T1 and B-T at a light receiver A-R on A side, which is coupled to the fiber-optic cable via a second port of the optical splitter A-OS on A side. At 1712, the method 1700 senses current generated by the light receiver A-R due to receiving some of the light transmitted by the light drivers A-T1 and B-T. At 1714, method 1700 determines data received from B side based on a difference between currents sensed at 1712 and at 1510 in FIG. 15.

At 1716, the method 1700 receives some of the light transmitted by the light drivers A-T1 and B-T at a light receiver B-R1 on B side, which is coupled to the fiber-optic cable via a first port of the optical splitter B-OS on B side. At 1718, using an optical power converter connected to the light receiver B-R1, the method 1700 generates DC power from the received light to power control electronics in the ESC.

At 1720, the method 1700 senses current generated by the light receiver B-R1 due to receiving some of the light transmitted by the light drivers A-T1 and B-T. At 1722, the method 1700 determines whether the sensed current is less than expected. At 1724, if the sensed current is less than expected, the method 1700 indicates a problem with one or more of the light source control circuits on A/B sides, the light driver A-T1, the optical splitter A-OS, the fiber-optic cable, the optical splitter B-OS, the light receiver B-R1, or the current sensor on B side. The method 1700 ends if the sensed current is not less than expected.

Figure 18:
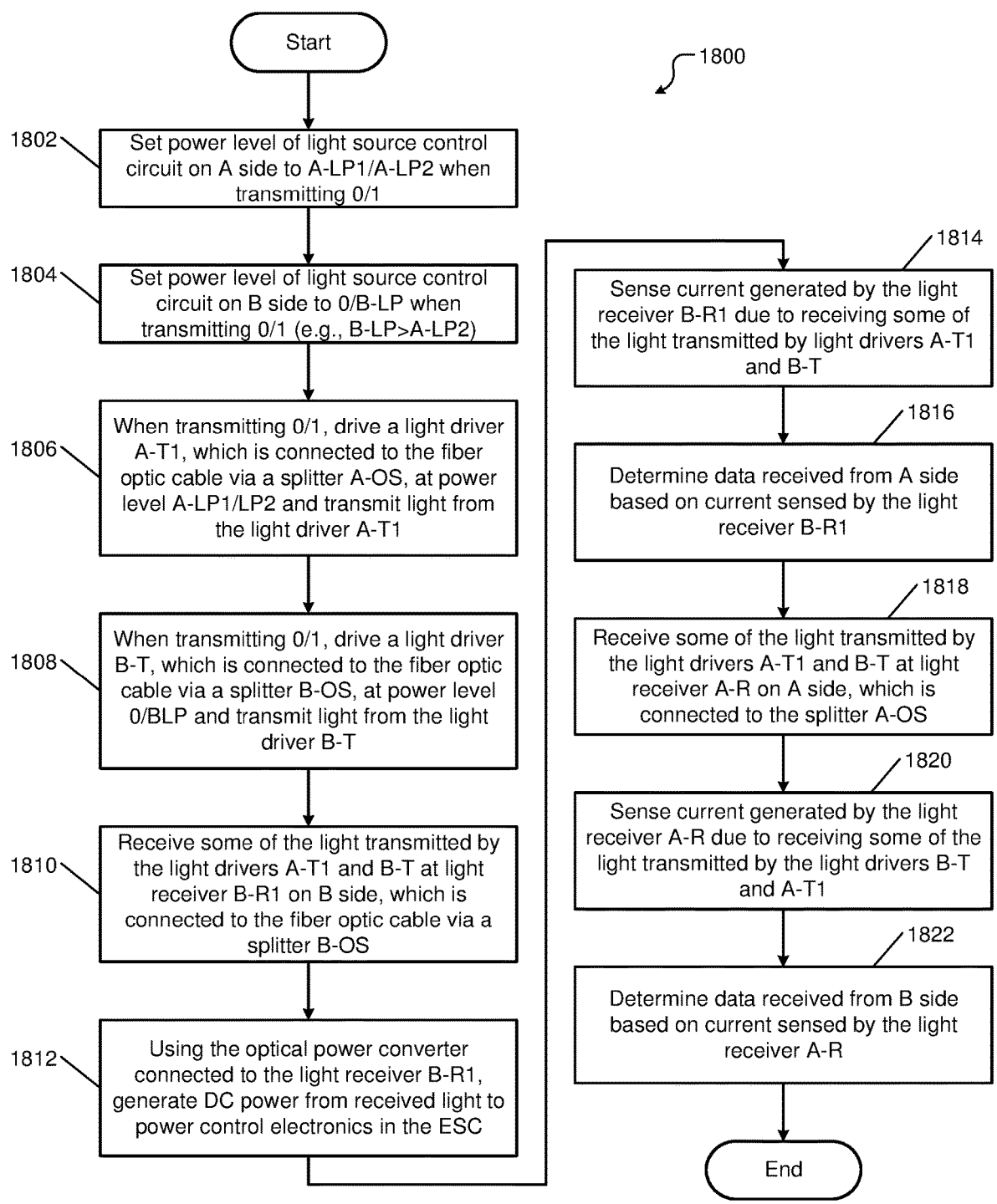
FIG. 18 shows a flowchart of a method performed by the system of FIG. 5 when operating in Mode 4.

FIG. 18 shows a method 1800 for power and data transmission from A side (master) to B side (slave) and data transmission from B side (slave) to A side (master). At 1802, the method 1800 sets the power level of the light source control circuit on A side to A-LP1/A-LP2 when transmitting data digitally as 0/1. At 1804, the method 1800 sets the power level of the light source control circuit on B side to 0/B-LP when transmitting data digitally as 0/1. For example, B-LP, which needs to different than A-LP2, maybe greater than A-LP2.

At 1806, depending on the data being transmitted (i.e., whether a 0 or a 1 is being transmitted) from side A to side B, the method 1800 drives the light driver A-T1 on A side based on the power level A-LP1 or A-LP2 of the light source control circuit on A side, and transmits light from the light driver A-T1 on A side, which is coupled to the fiber-optic cable via a first port of an optical splitter A-OS on A side.

At 1808, depending on the data being transmitted (i.e., whether a 0 or a 1 is being transmitted) from side B to side A, the method 1800 drives the light driver B-T on B side based on the power level 0 or B-LP of the light source control circuit on B side, and transmits light from the light driver B-T on B side, which is coupled to the fiber-optic cable via a second port of an optical splitter B-OS on B side.

At 1810, the method 1800 receives some of the light transmitted by the light drivers A-T1 and B-T at a light receiver B-R1 on B side, which is coupled to the fiber-optic cable via a first port of the optical splitter B-OS on B side. At 1812, using an optical power converter connected to the light receiver B-R1, the method 1800 generates DC power from the received light to power control electronics in the ESC.

At 1814, the method 1800 senses current generated by the light receiver B-R1 due to receiving some of the light transmitted by the light drivers A-T1 and B-T. At 1816, the method 1800 determines the data received from A side based on the current sensed by the light receiver B-R1.

At 1818, the method 1800 receives some of the light transmitted by the light drivers A-T1 and B-T at a light receiver A-R on A side, which is coupled to the fiber-optic cable via a second port of the optical splitter A-OS on A side. At 1820, the method 1800 senses current generated by the light receiver A-R due to receiving some of the light transmitted by the light drivers A-T1 and B-T. At 1822, the method 1800 determines the data received from B side based on the current sensed by the light receiver A-R.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support assembly configured to support a substrate during substrate processing in a processing chamber, the substrate support assembly comprising:
    a first optical receiver embedded in the substrate support assembly to receive a first optical signal and a first optical data through a fiber optic cable;
    a power converter embedded in the substrate support assembly to generate DC power based on the first optical signal and the first optical data received by the first optical receiver;
    a first circuit embedded in the substrate support assembly to:
        receive the DC power from the power converter; and
        receive a second data from a sensor disposed in the substrate support assembly in response to the first optical data, the sensor configured to sense a parameter associated with a process performed in the processing chamber; and
    a first optical transmitter embedded in the substrate support assembly to transmit the second data as a second optical data through the fiber optic cable.

2. The substrate support assembly of claim 1 wherein:
    the first optical receiver and the first optical transmitter are coupled to the fiber optic cable through a first optical splitter;
    the first optical receiver is configured to receive, through the first optical splitter, a portion of the second optical data transmitted by the first optical transmitter; and
    the power converter is configured to generate the DC power additionally based on the portion of the second optical data received by the first optical receiver.

3. The substrate support assembly of claim 2 further comprising:
    a first current sensor to sense current through the first optical receiver;
    wherein the first circuit is configured to determine, based on the sensed current, whether one or more of the first optical receiver, the first optical transmitter, the first optical splitter, and the first current sensor is malfunctioning.

4. The substrate support assembly of claim 2 further comprising:
a first current sensor to sense current through the first optical receiver;
wherein the first circuit is configured to determine, based on the sensed current, whether the first optical transmitter correctly transmitted the second optical data.

5. A system comprising the substrate support assembly of claim 1 and further comprising:
a second optical transmitter coupled to a remote end of the fiber optic cable to transmit the first optical signal and the first optical data through the fiber optic cable;
a second optical receiver coupled to the remote end of the fiber optic cable to receive the second optical data through the fiber optic cable; and
a controller to:
supply power to the second optical transmitter at a first power level when the second optical transmitter transmits the first optical signal; and
toggle the power supplied to the second optical transmitter between the first power level and a second power level when the second optical transmitter transmits the first optical data.

6. The system of claim 5 wherein the substrate support assembly further comprises:
a second circuit embedded in the substrate support assembly to toggle power supplied to the first optical transmitter between zero and a third power level when the first optical transmitter transmits the second optical data;
wherein the third power level is greater than the second power level; and
wherein the second power level is greater than the first power level.

7. The system of claim 5 wherein:
the second optical receiver and the second optical transmitter are coupled to the fiber optic cable through a second optical splitter;
the second optical receiver is configured to receive, through the second optical splitter, a portion of the first optical signal and the first optical data transmitted by the second optical transmitter;
a second current sensor to sense current through the second optical receiver; and
the controller is configured to determine, based on the sensed current, whether one or more of the second optical receiver, the second optical transmitter, the second optical splitter, and the second current sensor is malfunctioning.

8. The system of claim 5 wherein:
the second optical receiver and the second optical transmitter are coupled to the fiber optic cable through a second optical splitter;
the second optical receiver is configured to receive, through the second optical splitter, a portion of the first optical signal and the first optical data transmitted by the second optical transmitter;
a second current sensor to sense current through the second optical receiver; and
the controller is configured to determine, based on the sensed current, whether the second optical transmitter correctly transmitted the first optical data.

9. The system of claim 5 wherein:
the controller is configured to generate a first data to control a frequency at which the first circuit receives the second data from the sensor; and
the second optical transmitter is configured to transmit the first data as the first optical data.

10. The system of claim 5 wherein:
the controller is configured to generate a third data based on the second data to control one or more heaters disposed in the substrate support assembly;
the second optical transmitter is configured to transmit the third data as a third optical data;
the first optical receiver is configured to receive the third optical data; and
the first circuit is configured to obtain the third data from the third optical data and to control the one or more heaters based on the third data.

11. The system of claim 5 wherein:
the controller is configured to generate a third data to identify a component in the substrate support assembly;
the second optical transmitter is configured to transmit the third data as a third optical data;
the first optical receiver is configured to receive the third optical data; and
the first circuit is configured to obtain the third data from the third optical data and to associate the third data with the component.

12. The system of claim 5 wherein:
the first circuit is configured to receive a third data from a component in the substrate support assembly, the third data identifying the component;
the first optical transmitter is configured to transmit the third data as a third optical data;
the second optical receiver is configured to receive the third optical data;
the controller is configured to obtain the third data from the third optical data and to generate a fourth data based on the third data to control the component;
the second optical transmitter is configured to transmit the fourth data as a fourth optical data;
the first optical receiver is configured to receive the fourth optical data; and
the first circuit is configured to obtain the fourth data from the fourth optical data and to control the component based on the fourth data.

13. The system of claim 1 wherein the power converter is configured to supply the DC power to a control circuit embedded in the substrate support assembly to control one or more parameters associated with the process performed in the processing chamber.

14. A system comprising:
a first optical transmitter coupled to a first end of a fiber optic cable;
a first optical receiver coupled to the first end of the fiber optic cable;
a controller to supply power to the first optical transmitter to transmit a first optical signal and a first optical data through the fiber optic cable; and
a substrate support assembly configured to support a substrate during substrate processing in a processing chamber, the substrate support assembly comprising:
a second optical receiver embedded in the substrate support assembly coupled to a second end of the fiber optic cable to receive the first optical signal and the first optical data;
a power converter embedded in the substrate support assembly to generate DC power based on the first optical signal and the first optical data received by the second optical receiver;
a first circuit embedded in the substrate support assembly to receive the DC power and to receive a second data from a sensor disposed in the substrate support assembly in response to the first optical data, the sensor configured to sense a parameter associated with a process performed in the processing chamber; and a second optical transmitter embedded in the substrate support assembly coupled to the second end of the fiber optic cable to transmit the second data as a second optical data through the fiber optic cable based on power received from the first circuit.

15. The system of claim 14 wherein:

the controller is configured to:

supply the power to the first optical transmitter at a first power level to transmit the first optical signal through the fiber optic cable; and switch the power supplied to the first optical transmitter between the first power level and a second power level to transmit the first optical data through the fiber optic cable, the second power level being greater than the first power level; and the first circuit is configured to switch the power supplied to the second optical transmitter between zero and a third power level when the second optical transmitter transmits the second optical data, the third power level being greater than the second power level.

16. The system of claim 14 wherein:

the second optical receiver and the second optical transmitter are coupled to the fiber optic cable through an optical splitter;

the second optical receiver is configured to receive, through the optical splitter, a portion of the second optical data transmitted by the second optical transmitter; and the power converter is configured to generate the DC power additionally based on the portion of the second optical data received by the first optical receiver.

17. The system of claim 16 further comprising:

a current sensor to sense current through the second optical receiver;

wherein the first circuit is configured to determine, based on the sensed current, whether one or more of the second optical receiver, the second optical transmitter, the optical splitter, and the current sensor is malfunctioning.

18. The system of claim 16 further comprising:

a current sensor to sense current through the second optical receiver;

wherein the first circuit is configured to determine, based on the sensed current, whether the second optical transmitter correctly transmitted the second optical data.

19. The system of claim 14 wherein:

the first optical receiver and the first optical transmitter are coupled to the fiber optic cable through an optical splitter;

the first optical receiver is configured to receive, through the optical splitter, a portion of the first optical signal and the first optical data transmitted by the first optical transmitter;

a current sensor to sense current through the first optical receiver; and the controller is configured to determine, based on the sensed current, whether one or more of the first optical receiver, the first optical transmitter, the optical splitter, and the current sensor is malfunctioning.

20. The system of claim 14 wherein:

the first optical receiver and the first optical transmitter are coupled to the fiber optic cable through an optical splitter;

the first optical receiver is configured to receive, through the optical splitter, a portion of the first optical signal and the first optical data transmitted by the first optical transmitter;

a current sensor to sense current through the first optical receiver; and the controller is configured to determine, based on the sensed current, whether the first optical transmitter correctly transmitted the first optical data.

21. The system of claim 14 wherein:

the controller is configured to generate a first data to control a frequency at which the first circuit receives the second data from the sensor; and the first optical transmitter is configured to transmit the first data as the first optical data.

22. The system of claim 14 wherein:

the first optical receiver is configured to receive the second optical data;

the controller is configured to generate a third data based on the second data to control one or more heaters disposed in the substrate support assembly;

the first optical transmitter is configured to transmit the third data as a third optical data;

the second optical receiver is configured to receive the third optical data; and the first circuit is configured to obtain the third data from the third optical data and to control the one or more heaters based on the third data.

23. The system of claim 14 wherein:

the controller is configured to generate a third data to identify a component in the substrate support assembly;

the first optical transmitter is configured to transmit the third data as a third optical data;

the second optical receiver is configured to receive the third optical data; and the first circuit is configured to obtain the third data from the third optical data and to associate the third data with the component.

24. The system of claim 14 wherein:

the first circuit is configured to receive a third data from a component in the substrate support assembly, the third data identifying the component;

the second optical transmitter is configured to transmit the third data as a third optical data;

the first optical receiver is configured to receive the third optical data;

the controller is configured to obtain the third data from the third optical data and to generate a fourth data based on the third data to control the component;

the first optical transmitter is configured to transmit the fourth data as a fourth optical data;

the second optical receiver is configured to receive the fourth optical data; and the first circuit is configured to obtain the fourth data from the fourth optical data and to control the component based on the fourth data.

* * * * *